(12) United States Patent
Xiao et al.

(10) Patent No.: US 12,203,993 B1
(45) Date of Patent: Jan. 21, 2025

(54) DIAGNOSTIC SYSTEMS AND METHODS FOR BATTERY DEFECT IDENTIFICATION

(71) Applicant: SB Technology, Inc., Tarrytown, NY (US)

(72) Inventors: Ang Xiao, Woodbury, MN (US); Shivang Agarwal, Los Angeles, CA (US); Jordan E. Crivelli-Decker, El Cerrito, CA (US); Tyler Sours, Fort Collins, CO (US); Steffen Ridderbusch, London (GB); Brian Jehoon Wee, Oakland, CA (US); Brenda Miao, San Francisco, CA (US)

(73) Assignee: SB Technology, Inc., Tarrytown, NY (US)

( * ) Notice: Subject to any disclaimer, the term of this patent is extended or adjusted under 35 U.S.C. 154(b) by 0 days.

(21) Appl. No.: 18/639,892

(22) Filed: Apr. 18, 2024

(51) Int. Cl.
*G01R 31/36* (2020.01)
*G01R 31/367* (2019.01)
(Continued)

(52) U.S. Cl.
CPC ....... *G01R 31/3648* (2013.01); *G01R 31/367* (2019.01); *G01R 31/388* (2019.01); *G01R 31/389* (2019.01); *G01R 31/392* (2019.01)

(58) Field of Classification Search
CPC .......... G01R 31/3648; G01R 31/367; G01R 31/388; G01R 31/389; G01R 31/392
See application file for complete search history.

(56) References Cited

U.S. PATENT DOCUMENTS

| 11,226,374 B2 | 1/2022 | Severson et al. |
| 11,293,987 B2 | 4/2022 | Lee et al. |

(Continued)

FOREIGN PATENT DOCUMENTS

| CN | 110443377 | 11/2019 |
| CN | 113740752 | 12/2021 |

(Continued)

OTHER PUBLICATIONS

Greenbank et al., "Automated feature extraction and selection for data-driven models of rapid battery capacity fade and end of life," IEEE Transactions on Industrial Informatics, Aug. 20, 2021, 18(5):2965-2973.

(Continued)

*Primary Examiner* — John C Kuan
(74) *Attorney, Agent, or Firm* — Fish & Richardson P.C.

(57) ABSTRACT

Methods, systems, and apparatus, including computer programs encoded on computer storage media, for battery defect identification. One of the methods includes receiving battery test data of a battery cell. The battery test data includes data of at least one battery cell property in a battery test during at least one portion of a battery cycle. The battery test includes applying one or more pulses on the battery cell. The battery test data of the battery cell is provided as input to a machine learning model running on the computing system to predict whether the battery cell will experience catastrophic fade. The machine learning model has been trained using training data including battery test data of battery cells that experienced catastrophic fade. A prediction result for the battery cell is automatically generated by the machine learning model. An action is taken based on the prediction result for the battery cell.

21 Claims, 12 Drawing Sheets

(51) Int. Cl.
  *G01R 31/388* (2019.01)
  *G01R 31/389* (2019.01)
  *G01R 31/392* (2019.01)

(56) References Cited

U.S. PATENT DOCUMENTS

| | | | |
|---|---|---|---|
| 11,300,623 B2 | 4/2022 | Badwekar et al. | |
| 11,573,271 B1 * | 2/2023 | Eifert | G01R 31/3646 |
| 2019/0113577 A1 | 4/2019 | Severson et al. | |
| 2022/0074993 A1 * | 3/2022 | Aykol | B60L 58/10 |
| 2022/0137149 A1 | 5/2022 | Chueh et al. | |
| 2023/0029405 A1 | 1/2023 | Ou et al. | |

FOREIGN PATENT DOCUMENTS

| | | | |
|---|---|---|---|
| CN | 115656834 A | * | 1/2023 |
| CN | 115856646 | | 3/2023 |
| CN | 116774057 A | * | 9/2023 |
| GB | 2583510 | | 11/2020 |
| KR | 100903489 | | 6/2009 |
| KR | 20140129844 A | * | 11/2014 |
| KR | 20240027444 A | * | 3/2024 |
| TW | I794787 | | 3/2023 |
| WO | WO2022035151 | | 2/2022 |
| WO | WO 2022144542 | | 7/2022 |

OTHER PUBLICATIONS

Richardson et al., "Gaussian process regression for in situ capacity estimation of lithium-ion batteries," CoRR, Submitted on Dec. 18, 2017, arXiv: 1712.02595v2, 13 pages.

Severson et al., "Data-driven prediction of battery cycle life before capacity degradation," Nature Energy, May 2019, 4:383-391.

Zhang et al., "A machine learning-based framework for online prediction of battery ageing trajectory and lifetime using histogram data," Journal of Power Sources, Apr. 1, 2022, 526(231110):1-13.

* cited by examiner

| Example | Features | Model | Accuracy | Recall |
|---|---|---|---|---|
| Example 1 | HPPC @ cycle 2, 102, 202, 302, and 402 | Logistic regression | 0.53 | 1 |
| Example 2 | HPPC @ cycle 2 | Logistic regression | 0.69 | 0.50 |
| Example 3 | HPPC @ cycle 2, 102, 202, 302, and 402 | MLP | 0.93 | 1 |
| Example 4 | HPPC @ cycle 2 | MLP | 0.91 | 1 |
| Example 5 | HPPC @ cycle 2 | SVM | 0.92 | 1 |
| Example 6 | HPPC @ cycle 2 | Decision Tree | 1 | 1 |

FIG. 5

DIAGNOSTIC SYSTEMS AND METHODS FOR BATTERY DEFECT IDENTIFICATION

TECHNICAL FIELD

This specification relates to battery health assessment, particularly to battery defect identification.

BACKGROUND

Batteries are widely used due to low and falling costs, high energy densities, and long cycle lives. However, predicting battery lifespan normally requires long-term data collection and knowledge of battery degradation mechanisms.

SUMMARY

This specification describes technologies for battery defect identification. These technologies generally involve methods of identifying faulty batteries using machine learning models, which enables accurate and simplified battery defect prediction by utilizing data from just one early cycle of a battery's operation to identify catastrophic fade in the battery.

In general, one innovative aspect of the subject matter described in this specification can be embodied in methods that include the actions of receiving battery test data of a battery cell. The battery test data includes data of at least one battery cell property in a battery test during a battery cycle. The battery test includes applying one or more pulses on the battery cell. The actions include providing the battery test data of the battery cell as input to a machine learning model running on the computing system to predict whether the battery cell will experience catastrophic fade. The machine learning model has been trained using training data including battery test data of battery cells that experienced catastrophic fade. The actions can include: automatically generating a prediction result for the battery cell by the machine learning model, and taking an action based on the prediction result for the battery cell.

Another aspect of the subject matter described in this specification can be embodied in methods that include the actions of receiving battery test data in a single battery cycle of a battery cell. The battery test data includes data of at least one battery cell property in a battery test during at least one portion of the single battery cycle. The actions include providing the battery test data of the battery cell as input to a machine learning model running on the computing system to predict whether the battery cell will experience catastrophic fade. The machine learning model has been trained using training data including battery test data of battery cells that experienced catastrophic fade. The actions can include: automatically generating a prediction result for the battery cell by the machine learning model, and taking an action based on the prediction result for the battery cell.

Another aspect of the subject matter described in this specification can be embodied in methods that include the actions of receiving battery test data for at least a portion of a battery cycle; determining, based at least on the battery test data and using a machine learning model, whether a particular battery cell has a likelihood to experience catastrophic fade that is above a threshold, where the machine learning model has been trained using training data including battery test data for battery cells that experienced catastrophic fade; and taking an action at least partially based on the determination of whether the particular battery cell has a likelihood to experience catastrophic fade that is above the threshold.

Other embodiments of these aspects include corresponding computer systems, apparatus, and computer programs recorded on one or more computer storage devices, each configured to perform the actions of the methods. A system of one or more computers to be configured to perform particular operations or actions means that the system has installed software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

The foregoing and other embodiments can each optionally include one or more of the following features, alone or in combination. In particular, one embodiment includes all the following features in combination.

In some implementations, the prediction result indicates one of: i) the battery cell being a defective battery cell that will experience catastrophic fade, and ii) the battery cell being a normal battery cell that will not experience catastrophic fade.

In some implementations, the training data include battery test data for battery cells that have a normal lifetime without catastrophic fade.

In some implementations, the data of the at least one battery cell property in a battery test includes one or more values, and each of the one or more values corresponds to a respective pulse of the one or more pulses. Each of the one or more values is used as a respective input feature of one or more input features of the input to the machine learning model.

In some implementations, the actions include training the machine learning model using the training data; determining importance of the one or more input features of the input for the machine learning model based on a result of training the machine learning model; and adjusting one or more parameters of the machine learning model based on the determined importance of the one or more input features of the input.

In some implementations, the battery test includes at least one of Hybrid Pulse Power Characterization (HPPC) test, minimum pulse power characterization (MPPC) test, or Direct Current Internal Resistance (DCIR) test.

In some implementations, the battery cycle is a single cycle having a charging portion and a discharging portion. The at least one portion of the battery cycle includes at least one of the charging portion or the discharging portion. The battery test data comes from the discharging portion of the battery cycle. The machine learning model can be trained to predict whether the battery cell will experience catastrophic fade based on battery test data of the battery cell from only the at least one portion of the single cycle (e.g., the discharging portion of the single cycle), not from any other portion of the single cycle and not from any other cycle for the battery cell.

In some implementations, the one or more pulses include a current pulse applied on the battery cell when a capacity of the battery cell is changed by a predetermined percentage of state of charge (SOC). The at least one battery cell property includes an internal resistance corresponding to the current pulse.

In some implementations, the battery test includes applying each of a plurality of current pulses on the battery cell when the capacity of the battery cell is changed from a respective charge by the predetermined percentage of SOC. The battery test data includes data of a plurality of internal resistances that are determined based on the plurality of current pulses, and a number of the plurality of internal resistances is identical to a number of the plurality of current pulses.

In some implementations, the at least one portion of the battery cycle includes the discharging portion having multiple periods associated with the predetermined percentage of SOC. Each of the plurality of current pulses is a current discharging pulse applied in a respective period of the multiple periods.

In some implementations, the plurality of current pulses are applied in two or more last periods close to a completion of the discharging portion.

In some implementations, the battery test data comes only from a single cycle.

In some implementations, the single cycle is within first 20 cycles of a lifetime of the battery cell. In some implementations, the single cycle is within first 10 cycles of the lifetime of the battery cell.

In some implementations, the single cycle is 2nd cycle of the lifetime of the battery cell.

In some implementations, the battery test data includes data of the at least one battery cell property in the battery test during two or more battery cycles.

In some implementations, the machine learning model includes at least one nonlinear algorithm. The at least one nonlinear algorithm includes at least one of Multilayer Perceptron Classifier (MLP), support vector machines (SVM) with nonlinear kernels, Decision Trees, Random Forests, artificial neural network, or gradient boosting machine (GBM).

In some implementations, the machine learning model is a first machine learning model trained for defect identification for a first type of battery cells. A second machine learning mode running on the computing system has been trained for defect identification for a second type of battery cells. The first type of battery cells and the second type of battery cells have different battery cell chemistry.

In some implementations, the machine learning model is trained for defect identification for two or more types of battery cells that have different battery cell chemistry.

In some implementations, the actions include: after training the machine learning model with the training data, evaluating the machine learning model with evaluation data. The evaluation data includes battery test data of first battery cells that experienced catastrophic fade and battery test data of second battery cells that have a normal lifetime without catastrophic fade. The method includes adjusting, based on a result of evaluating the machine learning model, one or more parameters of the machine learning model to further train the machine learning model.

In some implementations, the actions include: updating one or more parameters of the machine learning model based on the battery test data of the battery cell and the prediction result for the battery cell.

In some implementations, the battery test data of the battery cells that experienced catastrophic fade includes data collected when a loss of capacity of one of the battery cells with respect to status of charge (SOC) in a single cycle is beyond a predetermined threshold.

In some implementations, receiving the battery test data of the battery cell includes: receiving the battery test data of the battery cell from a remote computing device in communication with the computing system through a communication network. Taking the action based on the prediction result for the battery cell includes at least one of: transmitting at least one of i) the prediction result for the battery cell or ii) an indication of a quality control (QC) for the battery cell to the remote computing device through the communication network, or presenting at least one of i) the prediction result for the battery cell or ii) an indication of a quality control (QC) for the battery cell on a web portal of the computing system to be accessible by the remote computing device.

In some implementations, determining whether the particular battery cell has the likelihood to experience catastrophic fade that is above the threshold includes: determining an accuracy of a prediction that the particular battery cell will experience catastrophic fade using the machine learning model; determining a precision of the accuracy of the prediction; and determining whether the particular battery cell has the likelihood to experience catastrophic fade that is above the threshold based on at least the accuracy and the precision of the accuracy.

In this specification, the term "catastrophic fade" refers to a sudden drop in a battery cell's peak performance and occurs when a rate of loss in the battery cell's peak capacity suddenly increases. The catastrophic fade can be a nonlinear fade and can occur at any suitable percentage of the battery cell's peak capacity. In some examples, a catastrophic fade in a battery cell, e.g., in a lithium-ion battery cell, can be defined numerically as a loss of over 20% of its total capacity within less than 1% of its expected lifecycle in terms of charge-discharge cycles. Alternatively, a catastrophic fade in a battery cell, e.g., in a lithium-ion battery cell, can be defined numerically as a loss of over 30% of its total capacity within less than 5% of its expected lifecycle in terms of charge-discharge cycle or as a loss of over 25% of its total capacity within less than 5% of its expected lifecycle in terms of charge-discharge cycles. The term "catastrophic failure" refers to a sudden and complete stopping or significant reduction of a battery cell's functionality.

The subject matter described in this specification can be implemented in particular embodiments so as to realize one or more of the following advantages. For example, the technologies disclosed herein enable a prediction of catastrophic fade of battery cells much before their lifetime expectancy with early-cycle battery test data. End user's prior knowledge of the underlying degradation mechanisms is not required for prediction, making the prediction method more universally applicable and user-friendly. In some implementations, a nonlinear machine learning (ML) model is utilized with early-cycle battery test data, e.g., Hybrid Pulse Power Characterization (HPPC) battery test data, to provide high accuracy in predicting the catastrophic fade of a battery cell. In some implementations, the technologies require just a single charge-discharge cycle, e.g., the second cycle, of discharge data from end users for prediction, which is cost-effective and time efficient. Moreover, enabling the use of just one early cycle of the battery's operation for defect identification can discover the battery defect at an early life stage, which reduces waste by preventing the use of batteries that may have catastrophic fade. Further, the technologies disclosed herein can be implemented as Software as a Service (SaaS) running in a cloud server, which can provide the service of battery defect identification to end users worldwide through network connection. The service can be applied to various types of battery cells for a broad application in industry, e.g., in electric vehicles and renewable energy storage systems. In addition, new battery test data from end users can be used to enhance accuracy of the ML model, allowing for personalized predictions tailed to individual user needs and making the model more robust.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

FIG. 5 shows example battery defect detection results with different combinations of battery test data and machine learning models.

Like reference numbers and designations in the various drawings indicate like elements.

DETAILED DESCRIPTION

A battery can include one or more battery cells. Catastrophic fade in a battery cell refers to a sudden and severe decline in performance and capacity of the battery cell. This phenomenon can be characterized by a rapid loss of the battery cell's ability to hold a charge and deliver power effectively. Unlike gradual degradation that occurs over an extended period of regular use, catastrophic fade happens unexpectedly and can render a battery cell virtually unusable in a short time frame, and can be an issue in applications where reliability and safety are critical, such as in electric vehicles or large-scale energy storage systems. The causes of catastrophic fade can vary, e.g., involving internal short circuits, thermal runaway, chemical breakdown, or physical damage to the battery cell's internal structure.

Implementations of the specification provide a data-driven predictive modeling method for identifying defective battery cells that show catastrophic fade much before their lifetime expectancy. The method offers a straightforward, cost-effective, and time-efficient solution for rapidly identifying battery cells experiencing catastrophic fade without prior knowledge of the above-mentioned degradation mechanisms.

In some implementations, a Hybrid Pulse Power Characterization (HPPC) test is conducted at every 10% State of Charge (SOC) interval during the discharge phase of a charge-discharge cycle. This test can be applicable over one or multiple charge-discharge cycles, e.g., charge-discharge cycles ranging from 1 to 100. In some implementations, the battery test data is gathered in an early cycle. The HPPC test at these specific SOC intervals can be configured to capture comprehensive battery performance data across a range of operating conditions.

In some implementations, a machine learning (ML) model is employed. The ML model can use any suitable nonlinear algorithms, including without limitation to, multilayer perceptron classifier (MLP), decision trees, random forests, neural networks, support vector machines (SVM) with nonlinear kernels, or gradient boosting machines. The ML model can be trained to analyze the data obtained from the HPPC test and predict catastrophic fade in batteries. This flexibility in the choice of machine learning architecture allows for adaptability and optimization in the data processing and analysis phase, facilitating accurate prediction of battery defects. Compared to linear ML model, the nonlinear ML model can provide better accuracy, precision, and recall performance in prediction of the catastrophic fade in battery cells.

Figure 1A:
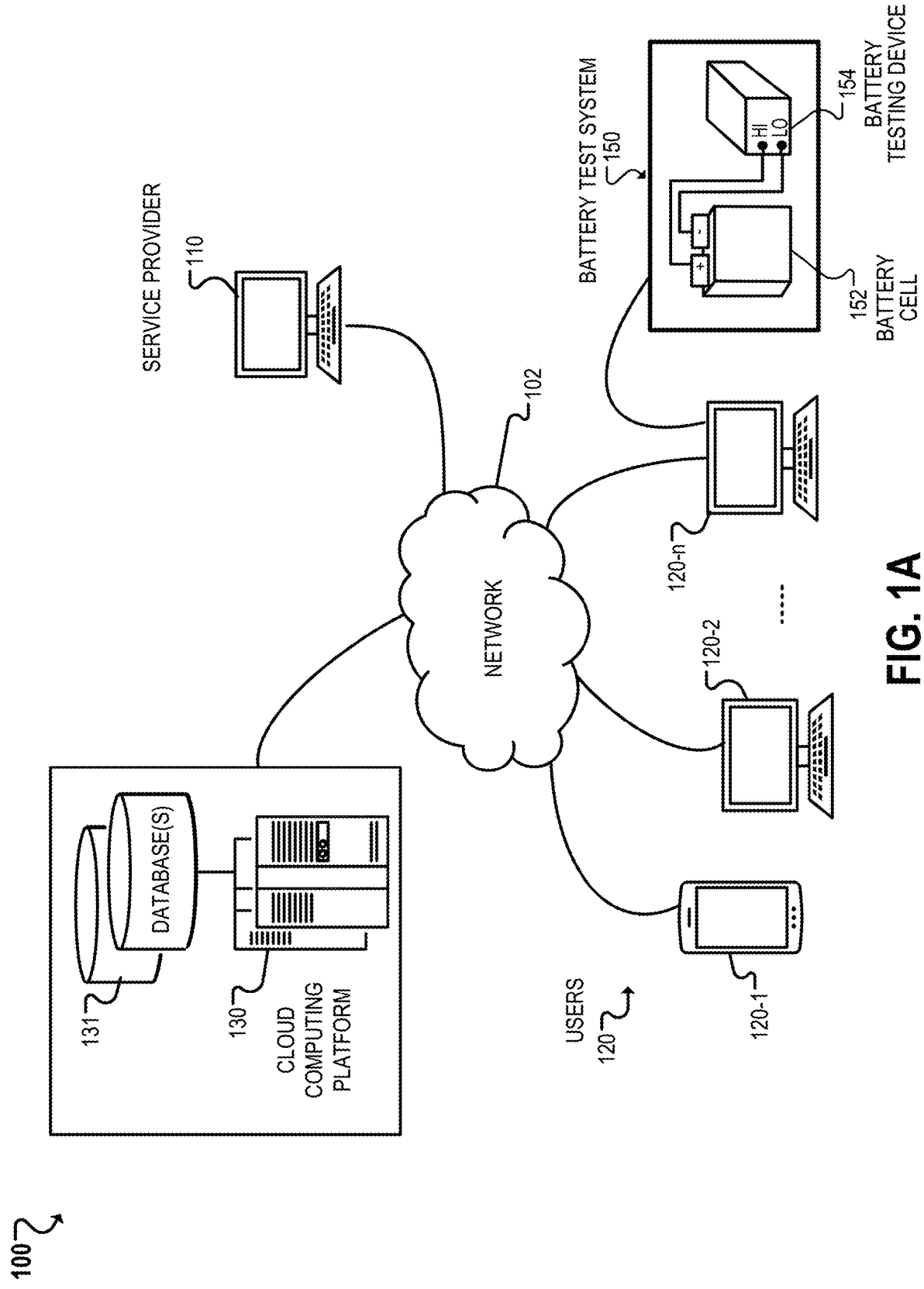
FIG. 1A is a schematic diagram of an example environment for battery defect identification.

FIG. 1A is a schematic diagram of an example environment 100 for battery defect identification. The operating environment 100 enables users (e.g., customers) to access a cloud computing platform, enables uses to upload their battery test data to the cloud computing platform for battery defect detection.

In some implementations, the operating environment 100 includes service-side computing devices 110, user-side computing devices 120 (e.g., mobile device 120-1, or computer 120-2, . . . , 120-$n$), a cloud computing platform 130, and a network 102. The service-side computing device 110 can be associated with a corresponding service provider (service company or business entity). The user-side computing devices 120 can be associated with one or more corresponding users. The network 102 can include a large computer network, such as a local area network (LAN), a wide area network (WAN), the Internet, a cellular network, or a combination thereof connecting any number of mobile computing devices, fixed computing devices and server systems. The service-side computing device 110 can be any type of devices, systems, or servers, e.g., a desktop computer, a mobile device, a smart mobile phone, a tablet computing device, a notebook, or a portable communication device.

The operating environment 100 can deploy a Software as a Service (SaaS) model.

SaaS is a software distribution model in which a cloud provider (e.g., the cloud computing platform 130) hosts applications and makes them available to end users over the network 102. In this model, an independent software vendor (ISV) (e.g., a service provider) may contract a third-party cloud provider (e.g., Amazon web services (AWS), Microsoft Azure, Google cloud platform (GCP)) to host the application (e.g., an application for battery defect identification). Users can access the software through a web browser without needing to install or maintain it locally on their own computers. Examples of SaaS can include productivity tools like Google Workspace, customer relationship management (CRM) systems like Salesforce, and project management platforms like Asana. With larger companies, such as Microsoft, the cloud provider might also be the software vendor.

The cloud computing platform 130 can include one or more computing devices and one or more machine-readable repositories, or databases. In some implementations, the cloud computing platform 130 can include one or more server computers in a local or distributed network each having one or more processing cores. The cloud computing platform 130 can be implemented in a parallel processing or peer-to-peer infrastructure or on a single device with one or more processors. An example architecture for the cloud computing platform 130 is described in reference to FIG. 1B. The users can submit requests for services (e.g., request for predicting catastrophic fade of battery cells) to the cloud computing platform 130, and the service provider can offer battery diagnosis results to satisfy the users' requests for services. The cloud computing platform 130 can authenticate or verify qualification of the service provider and/or associated service.

The cloud computing platform 130 can store information of the service provider and information of the service, e.g., in the databases 131. The service provider can register an account in the cloud computing platform 130 and enter or update the information of the service provider and/or the information of the service. For example, the service provider can provide a battery defect identification application stored in the cloud computing platform 130. The users can upload their battery test data to the battery defect identification application to obtain a prediction result. Based on user's input data, the battery defect identification application can automatically generate a prediction result for the battery cell by a machine learning model. The prediction result can indicate one of: i) the battery cell being a defective battery cell that will experience catastrophic fade, and ii) the battery cell being a normal battery cell that will not experience catastrophic fade. In some examples, a catastrophic fade in a lithium-ion battery can be defined as a loss of over 20% of its total capacity within less than 1% of its expected lifecycle in terms of charge-discharge cycles. The catastrophic fade can be an issue in applications where reliability and safety are critical, such as in electric vehicles or large-scale energy storage systems. Using the battery defect identification application, users can receive early predictions of potential catastrophic fade long before the expected end of the battery's lifespan. This enables users to take proactive measures, e.g., identifying defective battery cells for quality control, developing new battery chemistry based on the prediction results, and/or replacing battery cells before they fail.

The user-side computing devices 120 can include any appropriate type of device such as a laptop, a computer, tablet computing device, a handheld computer, a portable device, a mobile device, a personal digital assistant (PDA), a cellular telephone, a network appliance, a smart mobile phone, an enhanced general packet radio service (EGPRS) mobile phone, or any appropriate combination of any two or more of these data processing devices or other data processing devices. In some implementations, the user-side computer devices 120 is coupled to a battery test system 150. The battery test system 150 can include one or more battery cells 152 and one or more battery testing devices 154. The battery testing devices 154 can perform Hybrid Pulse Power Characterization (HPPC) battery tests on the battery cells 152. As described with further details below in FIGS. 3-4, this HPPC test protocol is designed to periodically evaluate the internal resistance of the battery cells, which is a critical parameter for understanding battery degradation and performance efficiency.

In some implementations, the battery test data is received by the cloud computing platform 130 from a remote user computing device (e.g., computing device 120-n) that is coupled to the battery test system 150. The remoting computing device is in communication with the cloud computing platform 130 through the network 102. In some implementations, the battery defect identification application stored in the cloud computing platform 130 takes an action based on the prediction result for the battery cell. The action can include transmitting at least one of i) the prediction result for the battery cell or ii) an indication of a quality control (QC) for the battery cell to the remote computing device through the communication network. Alternatively, or in addition, the action taken by the cloud computing platform 130 can include presenting at least one of i) the prediction result for the battery cell or ii) an indication of a quality control (QC) for the battery cell on a web portal of the computing system to be accessible by the remote computing device. As noted above, the prediction result indicates one of: i) the battery cell being a defective battery cell that will experience catastrophic fade, and ii) the battery cell being a normal battery cell that will not experience catastrophic fade. In some implementations, the indications of QC for the battery cell includes, without limitation to, suggested root cause analysis (e.g., reviewing manufacturing record), corrective actions (e.g., replacing the battery cells, adjusting manufacturing processes, updating quality control procedures, or improving design specifications), isolation of the problem (e.g., isolating the problematic battery cell or cells from the rest of the batch or production line), suggested quality control analysis, and/or research and development (e.g., recommending new materials or new process flows).

Figure 1B:
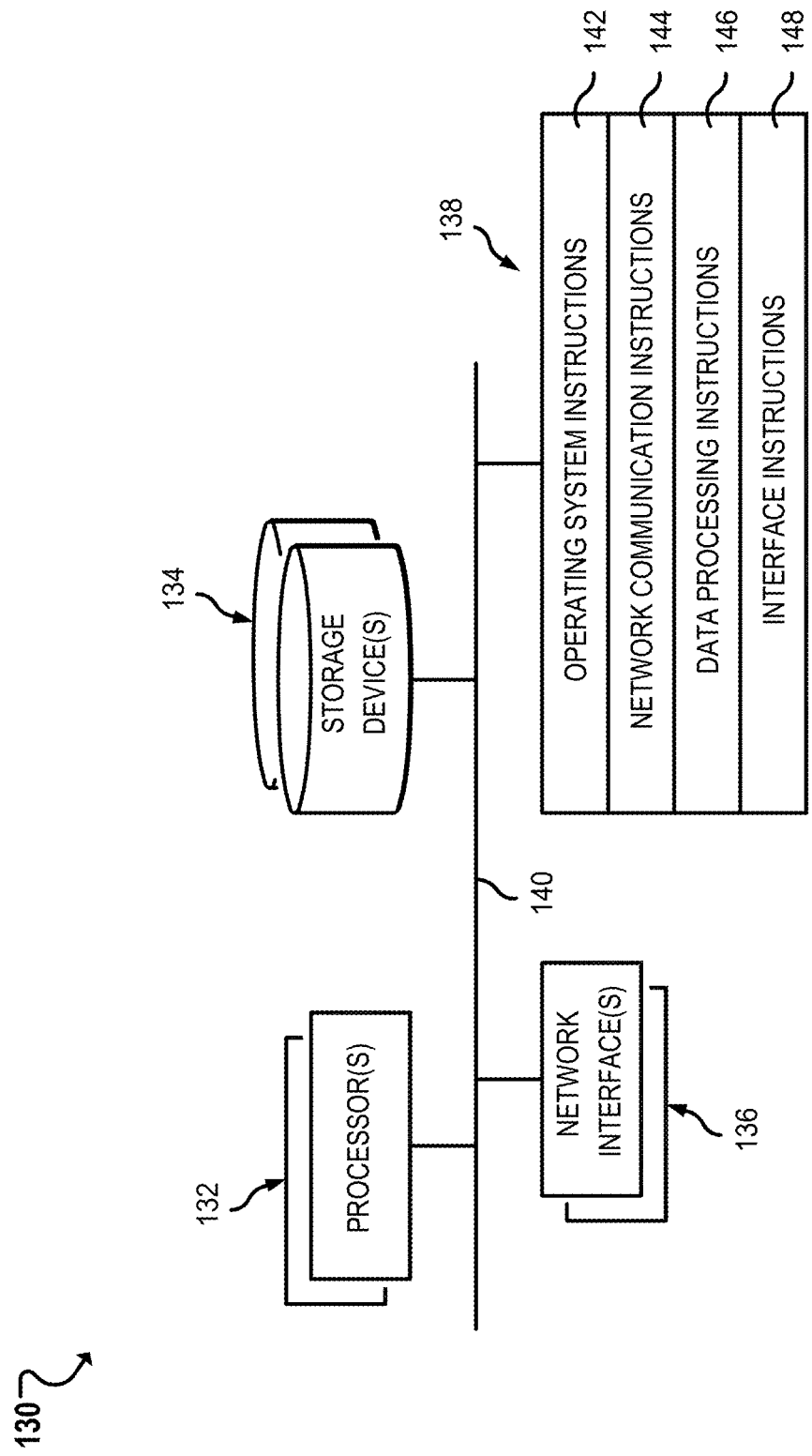
FIG. 1B is a schematic diagram of an example cloud computing system.

FIG. 1B is a schematic diagram of an example cloud computing system 130 described in reference to FIG. 1A. Other architectures are possible, including architectures with more or fewer components. In some implementations, the cloud computing system 130 includes one or more processors 132 (e.g., dual-core Intel® Xeon® Processors), one or more network interfaces 136, one or more storage devices 134 (e.g., hard disk, optical disk, flash memory) and one or more computer-readable mediums 138 (e.g., hard disk, optical disk, flash memory, etc.). These components can exchange communications and data over one or more communication channels 140 (e.g., buses), which can utilize various hardware and software for facilitating the transfer of data and control signals between components.

The term "computer-readable medium" refers to any medium that participates in providing instructions to processors 132 for execution, including without limitation, non-volatile media (e.g., optical or magnetic disks), volatile media (e.g., memory) and transmission media. Transmission media includes, without limitation, coaxial cables, copper wire and fiber optics.

Computer-readable mediums)138 can further include operating system 142 (e.g., Mac OS® server, Windows® NT server, Linux Server), network communication module 144, interface instructions 146 and data processing instructions 148.

Operating system 142 can be multi-user, multiprocessing, multitasking, multithreading, real time, etc. Operating system 142 performs basic tasks, including but not limited to: recognizing input from and providing output to devices 132, 134, 136 and 138; keeping track and managing files and directories on computer-readable mediums 138 (e.g., memory or a storage device); controlling peripheral devices; and managing traffic on the one or more communication channel) 140. Network communications module 144 includes various components for establishing and maintaining network connections (e.g., software for implementing communication protocols, such as TCP/IP, HTTP, etc.) and for creating a distributed streaming platform using, for example, Apache Kafka™. Data processing instructions 146 include server-side or backend software for implementing the server-side operations, as described in reference to FIG. 1A. Interface instructions 148 includes software for implementing a web server and/or portal for sending and receiving data to and from user-side computing devices 120 and service-side computing devices 110, as described in reference to FIG. 1A.

The cloud computing system 130 can be included in any computer device, including one or more server computers in a local or distributed network each having one or more processing cores. The cloud computing system 130 can be implemented in a parallel processing or peer-to-peer infrastructure or on a single device with one or more processors. Software can include multiple software components or can be a single body of code.

Figure 2A:
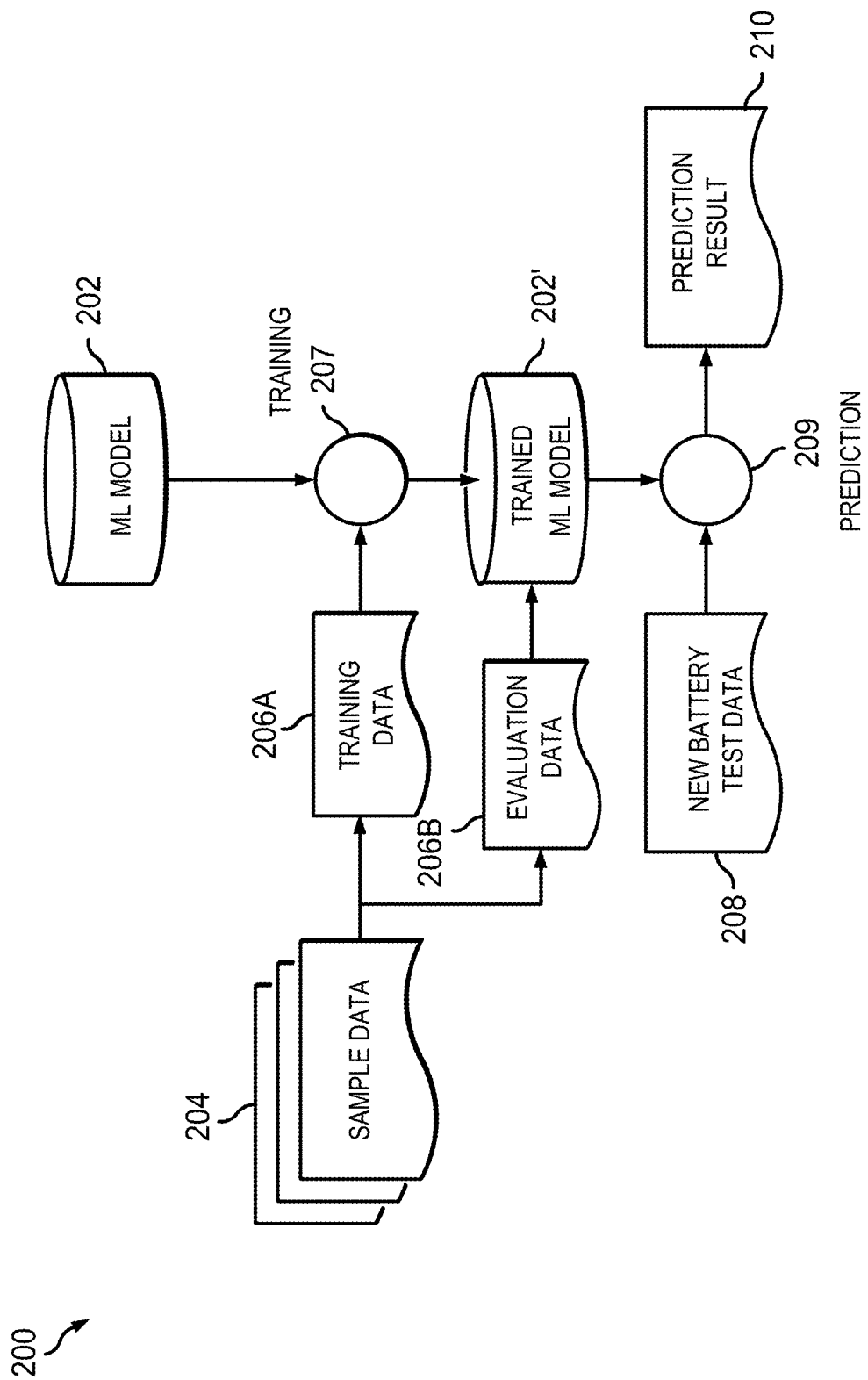
FIG. 2A is a schematic diagram illustrating an example of predicting battery defect based on a machine learning model.

FIG. 2A is a schematic diagram illustrating an example 200 of predicting battery defect based on a machine learning model. The battery defect prediction can be implemented by a computing system (e.g., the cloud computing system 130 of FIG. 1A or 1B) that can include one or more computing devices and one or more machine-readable repositories or databases that are in communication with each other.

The computing system can receive battery test data of a battery cell from an end user and provide the battery test data of the battery cell as input to a machine learning model 202' running on the computing system to predict whether the battery cell will experience catastrophic fade. The machine learning model 202' has been trained using training data 206A including battery test data of battery cells that experienced catastrophic fade and/or battery test data of battery cells that have a normal lifetime without catastrophic fade. In response, the computer system (e.g., the battery defect identification application stored in the computing platform) can automatically generate a prediction result 210 for the battery cell by the machine learning model 202'. As described with further details below in FIGS. 3 and 4, the battery test data includes data of at least one battery cell property (e.g., internal resistance) in a battery test during at least one battery charge-discharge cycle. The battery test can be a HPPC test, which includes applying one or more pulses on the battery cell in a battery cycle, and the battery cycle includes a charging portion and a discharging portion.

In some implementations, sample data 204 are prepared for training a machine learning model 202. The sample data 204 can include battery test data of a number of battery cells having a) defective battery cells that experienced catastrophic fade and b) normal battery cells that have a normal lifetime without catastrophic fade. The sample data 204 can be divided into training data 206A and evaluation data 206B. Each of the training data 206A and evaluation data 206B includes battery test data of defective battery cells and battery test data of normal battery cells.

The training data 206A can be separated into input parameters and output (or target) parameters for the training. The training data 206A can include, for each battery cell, data of the at least one battery cell property in the battery test as input parameters. For example, the training data 206A can include multiple internal resistances of the battery cell corresponding to multiple current pulses during one or more charge-discharge cycles in a HPPC test. As described with further details below in FIGS. 3-4, in some implementations, the training data 206A includes HPPC test data collected in a single battery charge-discharge cycle. In some implementations, the single battery cycle is within first 10 charge-discharge cycles of a lifetime of the battery cell. In some implementations, the training data 206A is the data collected in the second cycle of the lifetime of the battery cells. In some implementations, for each battery cell, the training data 206A includes 10 internal resistance values collected in the second charge-discharge cycle of the lifetime of the battery cell.

The training set 206A can include binary labels as output parameters indicating whether the battery experienced catastrophic fade or not. For example, the binary label 1 indicates the battery experienced a catastrophic fade, while the binary label 0 indicates the battery didn't experience a catastrophic fade.

The computing system can train a machine learning (ML) model 202 with respect to the training set 206A at a processing step 207 and return a trained ML model 202'. In some examples, the ML model 202 can be an artificial neural network, e.g., as illustrated with details in FIG. 2B. In some implementations, the ML model 202 includes at least one nonlinear algorithm. In some implementations, the ML model 202 includes, but not limited to, at least one of Multilayer Perceptron Classifier (MLP), support vector machines (SVM) with nonlinear kernels, Decision Trees, Random Forests, artificial neural network, or gradient boosting machine (GBM).

In some implementations, importance of the one or more input features of the input for the machine learning model is determined based on a result of training the machine learning model, as described with further details below in FIG. 7. The one or more input features of the input can correspond to one or more current pulses applied in the HPPC test. During the training process of the ML model, the algorithm can learn to make predictions or classifications by identifying patterns and relationships within the input data. As the model learns, it can assign weights or importance to each input feature, e.g., battery test data associated with each current pulse, based on how much they contribute to the model's predictive performance. The HPPC test in each battery cycle can include a number of pulses (e.g., 10 pulses), providing corresponding input data points (e.g., 10 input data points). Each pulse may have different levels of importance, e.g., influence in determining the prediction outcome. Determining the importance of each pulse can help identify the most relevant pulses that contribute significantly to the ML model 202' performance. In some implementations, one or more parameters, e.g., weight of each pulse, of the machine learning model 202 are adjusted based on the determined importance of the one or more input features, e.g., one or more internal resistances corresponding to one or more test pulses, of the input. For example, in response to determining that the two or more last pulses close to a completion of a discharging portion of a battery cycle have higher importance, the weights of these pulses in the ML model 202 can be adjusted to have a greater value than those of other pulses. In some implementations, the ML model 202 used to determine the importance of the input features includes Random Forest or Least Absolute Shrinkage and Selection Operator (lasso).

In some implementations, after training the ML model 202 with the training data 206A, the trained ML model 202' is evaluated with the evaluation data 206B. The evaluation data 206B can include battery test data of first battery cells that experienced catastrophic fade and battery test data of second battery cells that have a normal lifetime without catastrophic fade. The evaluation data 206B can provide independent measure of how well the trained ML model 202' has learned to make predictions or classifications on new, unseen instances. The battery test data of evaluation data 206B can be conformed with respect to properties of the battery cells as the training data 206A. For example, both the training data 206A and the evaluation data 206B can include internal resistance of the battery cells over a series of pulses (e.g., 10 pulses) during a single battery cycle test. In some implementations, the single battery cycle is within first 10 cycles of a lifetime of the battery cell. In some implementations, both the training data 206A and the evaluation data 206B are collected in the second battery cycle of the lifetime of the battery cell. The result of evaluating the ML model 202' can be compared to the ground truth values. Based on a result of evaluating the trained ML model 202', one or more parameters of the trained ML model 202' can be adjusted to further train the ML model 202'.

At a processing step 209, the computing system can use the trained ML model 202' together with new battery test data 208 of battery cells to be predicted provided by end users to jointly predict battery defect of the battery cells. The battery test data 208 from end users can be conformed with respect to properties of the battery cells as the training data 206A. For example, the new battery test data 208 can include internal resistances of the battery cells corresponding to a series of pulses (e.g., 10 pulses) within each charge-discharge cycle of one or more battery cycles. In some implementations, a single battery cycle data is used for prediction, and the single battery cycle is within first 10 cycles of a lifetime of the battery cell. In some implementations, both the training data 206A and the battery test data 208 are collected in the second battery cycle of the lifetime of the battery cell.

In some implementations, the prediction result 210 indicates one of: i) the battery cell being a defective battery cell that will experience catastrophic fade, and ii) the battery cell being a normal battery cell that will not experience catastrophic fade. In some implementations, determining whether a particular battery cell has the likelihood to experience catastrophic fade includes: determining an accuracy of a prediction that the particular battery cell will experience catastrophic fade using the ML model 202'; determining a precision of the accuracy of the prediction; and determining whether the particular battery cell has the likelihood to experience catastrophic fade that is above a threshold based on at least one of the accuracy or the precision of the accuracy. In some implementations, the threshold is set to be 0.5. For example, if the accuracy score of prediction score is higher than 0.5, then it can be determined that a particular battery cell has the likelihood to experience catastrophic fade. In contrast, if the accuracy score of prediction score is equal to or lower than 0.5, then it can be determined that a particular battery cell is unlikely to experience catastrophic fade.

In some implementations, one or more parameters of the ML model 202' is updated based on the battery test data 208 of the battery cell and the prediction result 210 for the battery cell. For example, the battery test data 208 provided by end users can be additionally used as the training data 206A to further train or refine the ML model 202', returning an updated trained ML model 202'. End user data may contain specific patterns or anomalies relevant to their use case or environment. By incorporating this data into the training process, the ML model 202 can be customized to better suit the needs of the end users. The diversity of the training data can also be increased.

The ML model 202' can be a first ML model trained for defect identification for a first type of battery cells. In some implementations, a second ML model running on the computing system is trained for defect identification for a second type of battery cells. The first type of battery cells and the second type of battery cells can have different battery cell chemistry. Some types of battery cell chemistry may be more susceptible to catastrophic fade than others due to varying structural characteristics, thermal stability or chemical reactions. For instance, lithium-ion batteries may be more susceptible to thermal runaway and/or catastrophic fade under conditions such as overcharging or high temperature. In contrast, lead-acid batteries may be less susceptible to catastrophic fade. To address this challenge, ML models 202 can be tailored and trained for specific battery types to enhance prediction accuracy.

In some implementations, the ML model 202 is trained for defect identification for two or more types of battery cells that have different battery cell chemistry. For example, the ML model 202 can be trained for both lithium-ion batteries and lead-acid batteries. A single model trained on multiple types of battery cells can be applied across various industries and applications. Such ML model can learn robust features that are relevant across different types of battery cells. This can enhance prediction performance for battery cells with variations and complexities.

Figure 2B:
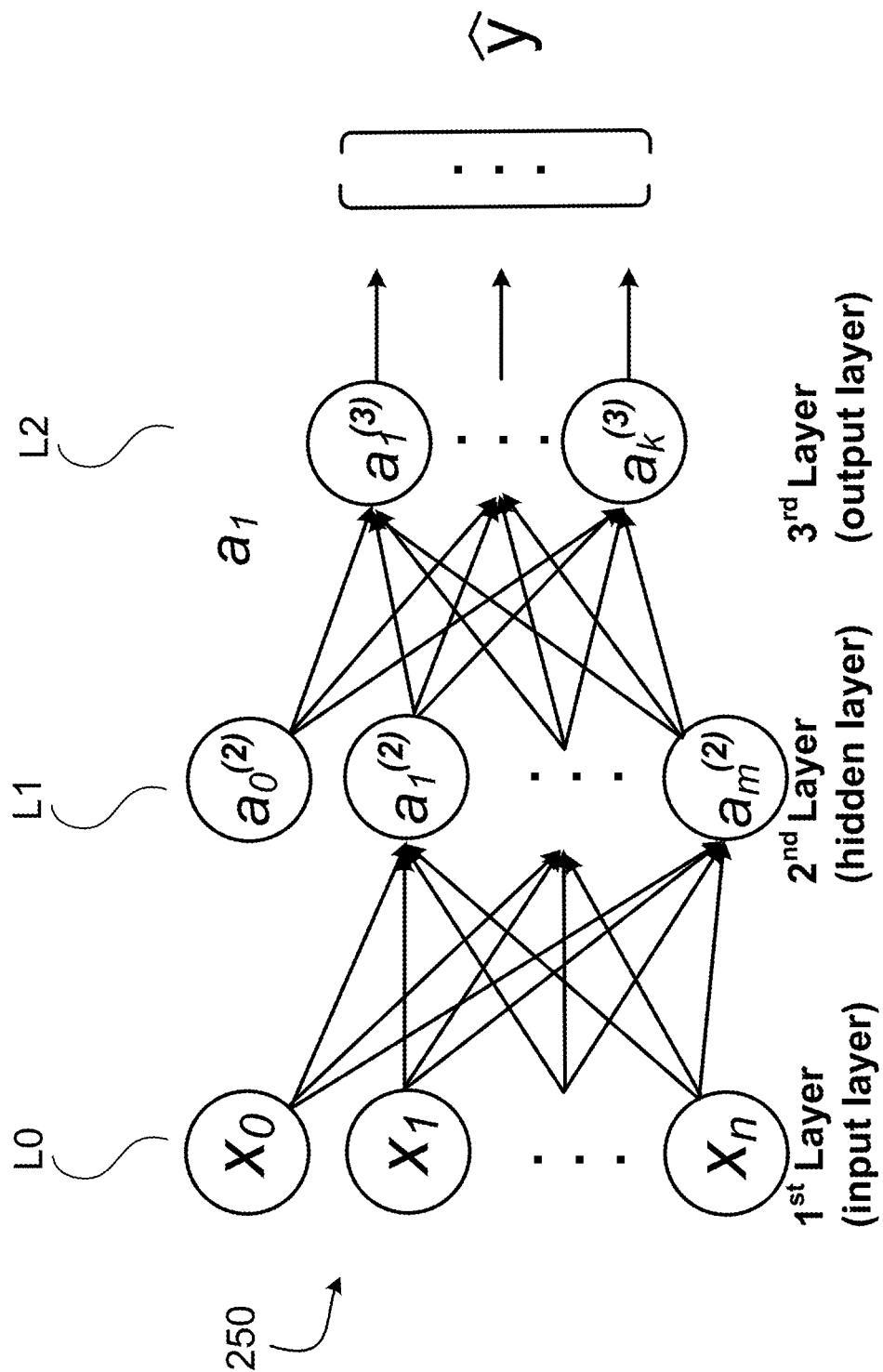
FIG. 2B is a schematic diagram illustrating an example Multilayer Perceptron Classifier (MLP) architecture.

FIG. 2B is a schematic diagram illustrating an example Multilayer Perceptron Classifier (MLP) architecture 250. The MLP 250 can be implemented as the ML model 202 in FIG. 2A. A MLP is a type of artificial neural network (ANN) designed for supervised learning tasks, particularly in classification problems. It can include multiple layers of interconnected neurons, arranged in a feedforward manner. Each neuron in an MLP receives input signals, processes them through an activation function, and passes the output to neurons in the subsequent layer. In some examples, as illustrated in FIG. 2B, the MLP can include an input layer L0, one or more hidden layers L1, and an output layer L2. Each layer contains neurons that apply a nonlinear activation function to their weighted inputs. MLPs are capable of learning complex patterns by adjusting these weights through a process known as backpropagation. This makes them effective for tasks involving complex, nonlinear relationships, e.g., the possibility of battery catastrophic fade and battery test data 208 described in this disclosure.

As shown in FIG. 2B, the MLP 250 is a collection of connected units or nodes, e.g., $X_0, X_1, \ldots, X_n, a_0^{(2)}, a_1^{(2)}, \ldots, a_m^{(2)}, a_1^{(3)}, \ldots, a_k^{(3)}$, which are called artificial neurons. The artificial neurons are organized in layers. For example, the input layer L0 includes artificial neurons $X_0, X_1, \ldots, X_n$; the hidden layer L0 includes artificial neurons $a_0^{(2)}, a_1^{(2)}, \ldots, a_m^{(2)}$; and output layer L2 includes artificial neurons $a_1^{(3)}, \ldots, a_k^{(3)}$.

In some implementations, different layers of an MLP perform different kinds of transformations on their inputs. One of the layers is a first or input layer of the MLP, e.g., layer L0, while another layer is a last or output layer of the MLP, e.g., layer L2. The MLP includes one or more internal layers, e.g., layer L1, between the input layer and the output layer. Signals travel from the input layer L0 to the output layer L2, after traversing the internal layers L1 one or more times.

In some implementations, each connection between artificial neurons, e.g., a connection from $X_0$ to $a_m^{(2)}$, or from $a_m^{(2)}$ to $a_k^{(2)}$, can transmit a signal from one to another. The artificial neuron that receives the signal can process it and then signal artificial neurons connected to it. In some implementations, the signal at a connection between artificial neurons is a real number, and the output of each artificial neuron is calculated by a non-linear function of the sum of its inputs. Each connection can have a weight that adjusts as learning proceeds. The weight increases or decreases the strength of the signal at a connection.

In some implementations, a set of input data (e.g., from each sample) is presented to an MLP, e.g., at an input layer like L0. A series of computations is performed at each subsequent layer such as L1. In the fully-connected network illustrated in FIG. 2B, an output computation from each node is presented to all nodes in the subsequent layer. The final layer such as L2 of the trained MLP can be associated with determining a classification match to the input data, e.g., from a fixed set of labeled candidates, which can be referred to as "supervised learning."

In some implementations, the MLP model includes two hidden layers (not shown). The first hidden layer includes 60 neurons, while the second hidden layer includes 16 neurons. In some implementations, the learning rate of the MLP is configured to be 1e-4 to regulate the size of the steps taken during the optimization process. In some implementations, a Limited-memory Broyden-Fletcher-Goldfarb-Shanno (LBFGS) algorithm is used from the scikit-learn library in the MLP model.

It is understood that the ML model 202 include any other suitable nonlinear algorithm. In some implementations, the ML model 202 is a support vector machines (SVM). In some implementations, a regularizing parameter of the SVM model is set to 0.1. In some implementations, a nonlinear kernels model is used in the SVM model, which allows SVM to handle nonlinear relationships between features by implicitly mapping the input features into a higher-dimensional space where the data points become linearly separable.

In some implementations, the ML model 202 is a gradient Boosting Machine (GBM). The GBM can work by sequentially training multiple weak learners, typically decision trees, in a boosting fashion, where each tree is trained to correct the errors made by the previous ones. During training, GBM minimizes a loss function by iteratively fitting new models to the residuals of the previous models. GBM can provide higher predictive accuracy and handle complex interactions. In some implementations, the default parameters from scikit-learn library are used for GBM model.

In some implementations, the ML model 202 is a Random Forest (RF). The RF can operate by constructing a multitude of decision trees during training and output the mode of the classes for classification or the mean prediction for regression. Each tree in the forest can be built using a random subset of the features and a random subset of the training data 206A or the evaluation data 206B or the new battery test data 208, which helps to decorrelate the trees and reduce overfitting. Random Forests can be robust to noise and outliers, handle high-dimensional data well, and be capable of capturing complex relationships within the data. In some implementations, the default parameters from scikit-learn library are used for RF model.

Figure 3:
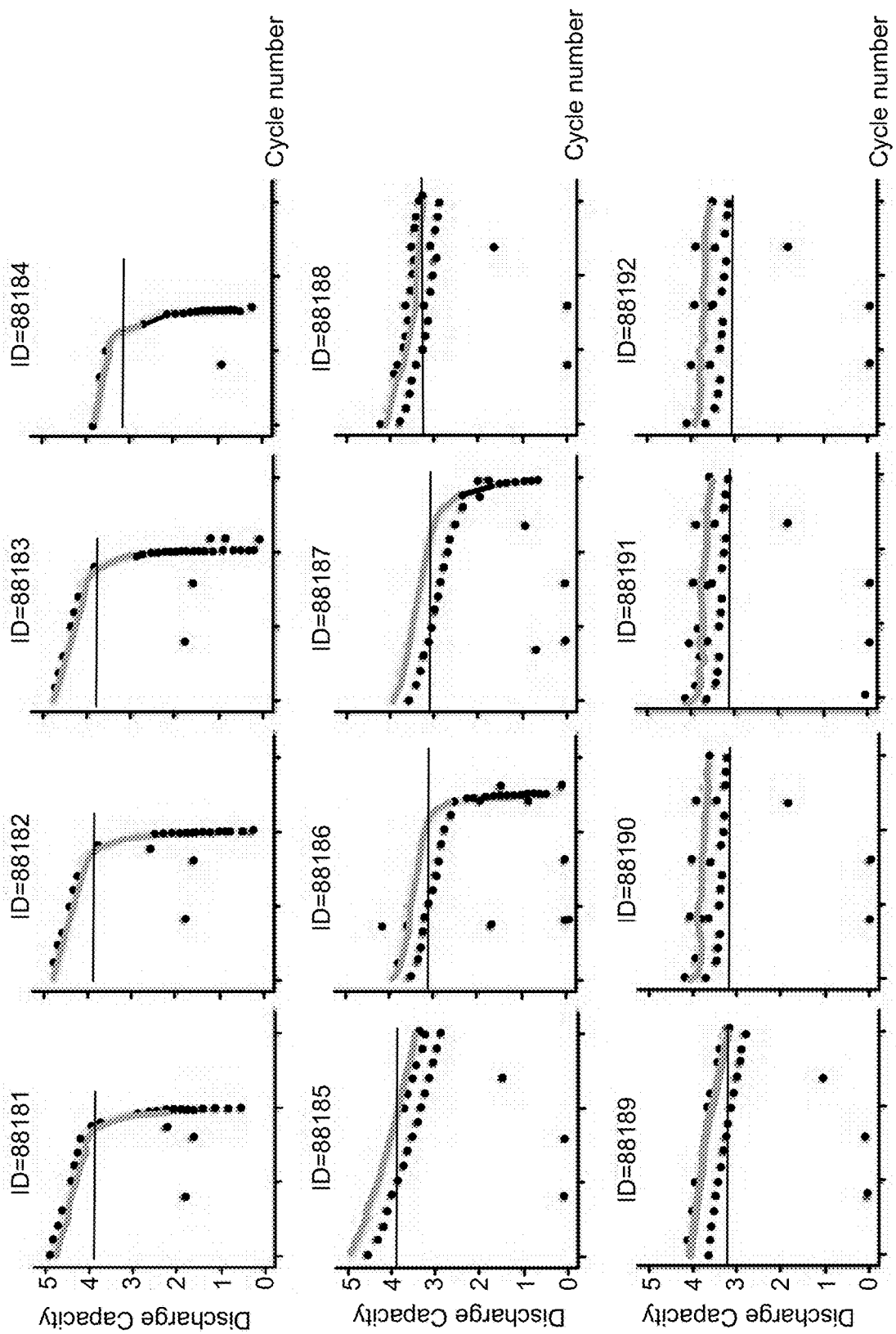
FIG. 3 illustrates example curves for battery discharge capacity versus a number of cycles.

FIG. 3 illustrates example curves for battery discharge capacity versus a number of cycles for different battery cells. Each battery cycle includes a charging portion and a discharging portion. In the present example, in the charging portion, the sample battery cells are charged from a lower voltage (e.g., 3.0 V) to a higher voltage (e.g., 4.2 V), while in the discharging portion, the battery cells are discharged from the higher voltage down to the lower voltage.

Batteries may degrade gradually in a linear way as undergoing numerous cycles of charging and discharging cycles. The end-of-life (EOL) of batteries can be defined as when the cell reaches a threshold percentage (e.g., below 85%, below 80%, or below 70%) of its previous maximum discharge capacity. In some situations, batteries degrade in a non-linear way, e.g., a catastrophic fade. The nonlinear behavior can be characterized by a rapid decline in performance. In some implementations, as noted above, the catastrophic fade in a battery cell can be defined numerically as a loss of over 20% of its total capacity within less than 1% of its expected lifecycle in terms of charge-discharge cycles.

For the example battery cells used in FIG. 3, the cell composition includes a graphite/silicon alloy anode, Lithium-Nickel-Manganese-Cobalt-Oxide (NMC) cathodes, and an electrolyte comprising $LiPF_6$ carbonates. These battery cells are configured in the 18650 cylindrical formats with a capacity of approximately 1 Ah. These battery cells are subjected to cycling between predefined voltage thresholds, e.g., at 4.2 V and 3.0 V, with consistent charge and discharge rate of 1 C.

During battery charge-discharge cycles, continuous monitoring and recording of the battery cell's voltage and current are carried out to generate a discharge voltage curve for each cell, as depicted in FIG. 3, showing 12 sample battery cells. Among them, six cells show catastrophic fade, e.g., battery ID 88181, 88182, 88183, 88184, 88186 and 88187. It is to be understood that battery cells may eventually nosedive (e.g., decline rapidly) after reaching its knee point at its expected EOL. Catastrophic fade occurs when a battery cell reaches its knee point before its expected EOL. Therefore, the prediction of battery cell's tendency to nosedive becomes crucial to enhance product reliability.

In some implementations, during the first cycle, standard charging and/or discharging are performed. The standard charge and discharging rate can be specified by the manufacturer and depend on the type and chemistry of the battery. For example, lithium-ion batteries can have standard charge/discharge rates ranging from 0.3 C to 1 C. Subsequently, in the second cycle, a Hybrid Pulse Power Characterization (HPPC) test is implemented, as described with further details below in FIG. 4. Following this, from the third cycle to the 101st cycle, the battery cells are subjected to standard charging and discharging cycles. However, during the 102nd cycle, another HPPC test is applied to the battery cells. This cyclic pattern may be reiterated multiple times. In some implementations, the HPPC test is applied every 100 cycles.

In some implementations, the HPPC test data from the second cycle and the $102^{nd}$ cycle data are used as the training data 206A (e.g., as illustrated in FIG. 2A). Accordingly, the evaluation data 206B or new battery test data 208 can include the HPPC test data from the same two cycles. In some implementations, the HPPC test data from only the second cycle is used for training the ML model 202. It is understood that the HPPC test can be conducted at any cycle, e.g., the third cycle, or the $103^{rd}$ cycle. In some implementations, the first HPPC test is conducted on battery cells within first 100 cycles.

In some implementations, more than 10 sample battery cells are used to collect HPPC test data. In some implementations, the test data for the sample battery cells are divided into three groups, training data 206A, evaluation data 206B, held-out test data. As illustrated in FIG. 2A, the training data 206A can be used to train the ML model 202, and the evaluation data 206B can be used to evaluate how well the trained ML model 202' has learned to make predictions or classifications on new, unseen instances. The held-out test data can be used to address the class imbalance challenge, as described with further details below in FIGS. 6A-6F. In some implementations, the battery test data for sample battery cells is split in a 70-20-10 ratio representing the training data 206A, the evaluation data 206B, and the held-out test data.

Figure 4:
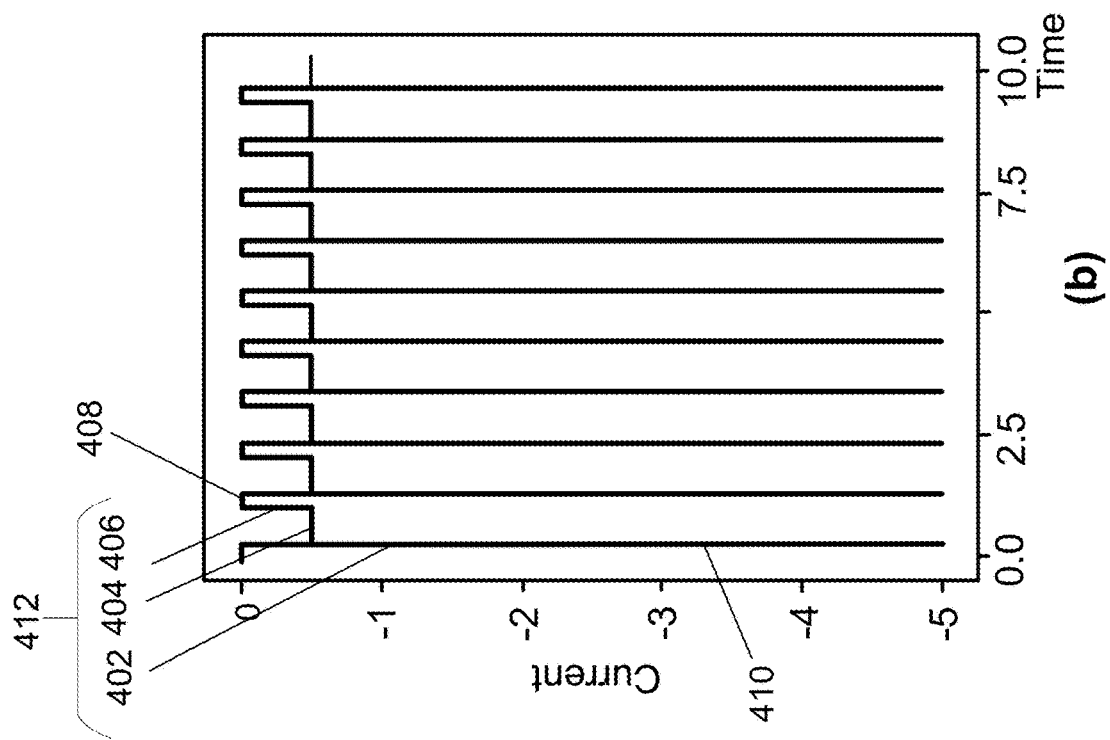
FIG. 4 illustrates example HPPC testing at a discharge cycle.
Figure 4:
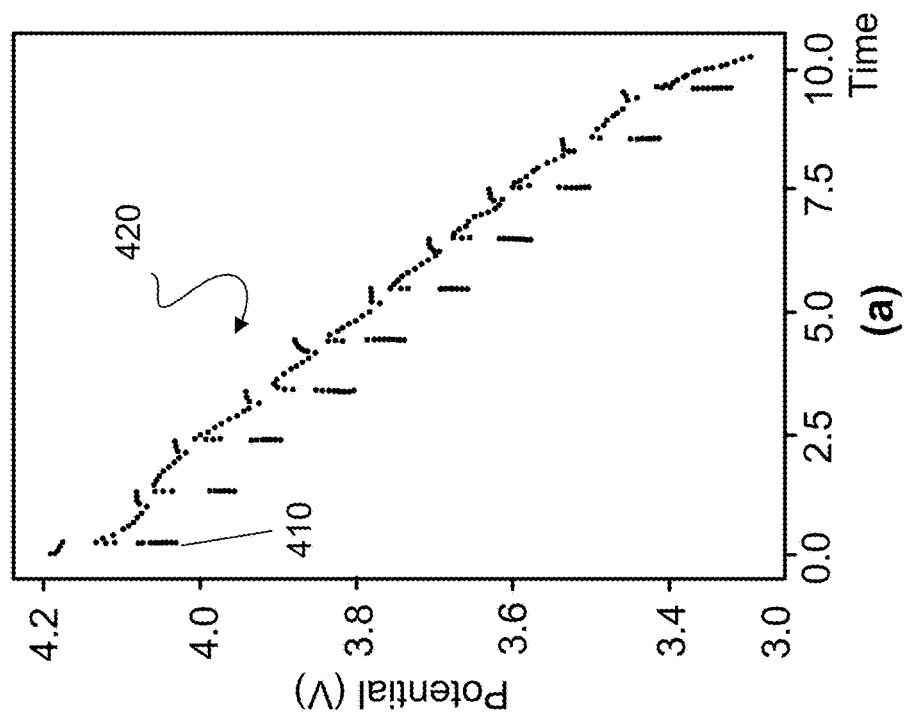

FIG. 4 illustrates example HPPC testing at a discharge portion of a battery cycle. During battery test, a cycling protocol incorporating HPPC checkup cycles can be employed, e.g., to monitor and assess the health and performance of the battery cells throughout their operational life. This protocol is designed to periodically evaluate the internal resistance of the battery cell, which is a critical parameter for understanding battery degradation and performance efficiency. In some implementations, a HPPC checkup cycle is initiated every 100 cycles throughout the lifetime of the battery, beginning at cycle 2. Each HPPC checkup cycle can include a series of 10 discrete pulses administered at varying states of charge (SOC), decrementing in 10% intervals from 90% to 0%. These pulses can be controlled to minimize disruption to the battery's regular usage cycle, ensuring that the diagnostic process does not adversely affect the battery's performance or lifespan.

In some implementations, before HPPC test, the battery cells can be initially discharged to a certain state, referred to as the "discharged state." After reaching the discharged state, the battery cells can be then charged to their maximum voltage (e.g., Vmax 4.2V). This standard charging process is performed, for example, using a charging rate of C/3 with constant current (CC) and a manufacturer-recommended constant voltage (CV) hold. Following the charging process, a 1-hour rest period is conducted. This one-hour rest at open-circuit immediately prior to the discharging pulse can allow the battery to reach electrochemical and thermal equilibrium. After the rest period, the battery cells can start the HPPC test.

As noted above, a battery cycle includes a charging portion and a discharging portion 420. In some implementations, in the charging portion, the battery cells are charged from 3.0 V to 4.2 V, while in the discharging portion, the battery cells are discharged from 4.2 V down to 3.0 V. In some implementations, the HPPC test is conducted during the discharging portion of a battery cycle. In some implementations, the HPPC test applies a plurality of discharging pulses 410 during the discharging portion 420, e.g., as illustrated in diagram (b) of FIG. 4. In some implementations, the battery test includes applying each of a plurality of discharging pulses (e.g., current pulses) 410 on the battery cell when the capacity of the battery cell is changed from a respective charge by the predetermined percentage of state of charge (SOC). In some implementations, the predetermined percentage of SOC is 10%. In other words, the discharging pulse 410 can be applied at each 10% depth-of-discharge increment (as determined from the beginning of life rated capacity), starting from a fully charged state (e.g., 4.2 V), and ending at a fully discharged state (e.g., 3.0 V). Therefore, a battery cell can be subjected to a total of ten HPPC discharging pulses 410 for each charge-discharge cycle, as illustrated in diagram (a) of FIG. 4.

In some implementations, the HPPC test can be performed in the following manner. After a charging portion, the battery cell rests for 15 minutes at an open circuit, and then a 1 C discharging pulse (e.g., the discharging pulse 410) is applied for 30 seconds. Following the discharging pulse, the battery cell is discharged at a rate of C/10 until it reaches 90% SOC. When the battery cell reaches 90% SOC, the battery cell is again allowed to rest at the open circuit for 15 minutes, and then another 1 C discharging pulse is applied for 30 seconds. Following the discharging pulse, the battery cell is discharged at a rate of C/10 until it reaches 80% SOC. This process repeats every 10% SOC until the battery cell is fully discharged. In some implementations, at least one portion of the battery cycle, e.g., a discharging portion, has multiple periods associated with the predetermined percentage of SOC (e.g., 90%, 80%, . . . , 10%). Each of the current pulses can be a current discharging pulse 410 applied in the respective period.

The application of each discharging pulse 410 can induce a corresponding voltage drop from which an internal resistance measurement, R, can be obtained. These resistance measurements are then obtained for all 10 discharges pulses 410 at various SOCs during the discharging portion 420 of a battery cycle. In some implementations, the internal resistance R is determined using equation (1):

$$R = \frac{V_{t0} - V_{t1}}{I_{t1} - I_{t0}} \quad (1)$$

where $V_{t0}$ is the respective battery voltage before each discharging pulse is applied (e.g., 90% of Vmax, 80% of Vmax, . . . , 10% of Vmax) and $V_{t1}$ is the battery voltage after discharges finishes but before the waiting period starts. Similarly, $I_{t0}$ is the battery current before discharge begins, $I_{t1}$ is the discharge current of the discharging pulse 410.

In some implementations, the battery test data 208 includes data of a plurality of internal resistances that are determined based on the plurality of discharging pulses 410, and a number of the plurality of internal resistances is identical to a number of the plurality of discharging pulses 410. In other words, the internal resistance corresponding to a respective discharging pulse 410 can be calculated. Therefore, for the discharging portion 420 of each battery cycle, 10 data points of internal resistance can be obtained from HPPC tests corresponding to 10 current pulses 410.

In some implementations, the at least one portion, e.g., the discharging portion 420, of the battery cycle includes the discharging portion having multiple periods 412 (e.g., 10 periods) associated with the predetermined percentage of SOC (e.g., 10%). The periods can be the periods 412 as illustrated in diagram (b) of FIG. 4, which can include a discharging phase 402, a rest phase 404 and a charging phase 406. As noted above, each of the plurality of discharging pulses 410 is applied in a respective period 412 of the multiple periods.

In some implementations, the data of the at least one battery cell property in a battery test includes one or more values, and each of the one or more values corresponds to a respective discharging pulse 410 of the one or more discharging pulses 410. For example, the data of the internal resistances in a battery test can include 10 values, with each data corresponding to a respective discharging pulse 410. In some implementations, each of the one or more values is used as a respective input feature of one or more input features of the input to the ML model 202. For example, the data corresponding to the 10 discharging pulses 410 can be used as 10 input features for the ML model 202. As described below in FIG. 7, the ML model 202 can be used to determine the importance of the input features to help identify the most relevant pulses 410 that contribute significantly to the ML's model performance. In some implementations, besides the values of the internal resistances, the input of the ML model 202 can include values of one or more other properties of the battery cell.

In some implementations, the training data 206A includes the battery test data 208 of the battery cells that experienced catastrophic fade, which is collected when a loss of capacity of one of the battery cells with respect to status of charge (SOC) in a single cycle is beyond a predetermined threshold. In some implementations, the predetermined threshold is a loss of over 20% of maximum capacity of a battery cell within less than 1% of its expected lifecycle in terms of charge-discharge cycles.

Although not shown, it is to be understood that the HPPC test can be conducted in the charging portion of a charge-discharge cycle. It is further to be understood that the battery test can include any other pulse-based test, e.g., minimum pulse power characterization (MPPC) test, or Direct Current Internal Resistance (DCIR) test. MPPC can be similar to HPPC in that both tests subject the battery to short pulses of current at varying charge levels, measuring the voltage response to evaluate performance. However, MPPC distinguishes from HPPC by allowing for variability in pulse parameters such as amplitude, duration, or frequency. Similarly, DCIR testing substantially resembles HPPC by applying discrete pulses to measure voltage drop across terminals.

FIG. 5 is a table showing example battery defect detection results with different combinations of battery test data 208 and ML models. As illustrated in FIG. 5, non-linear ML models 202, e.g., MLP, SVM, and decision tree in examples 3 through 6, provide higher accuracy and recall than linear ML models, e.g., logistic regression in examples 1 and 2. Accuracy is a measure of the overall correctness of the model. It calculates the ratio of correctly predicted instances to the total number of instances. Recall, also known as sensitivity or true positive rate, measures the ability of the model to find all the relevant cases within a dataset. It calculates the ratio of correctly predicted positive instances to the total number of actual positive instances. As illustrated in FIG. 5, non-linear ML models 202 (e.g., MLP, SVM and decision tree) can achieve accuracy level higher than 0.91. In contrast, the linear ML models (e.g., logistic regression) can only achieve accuracy level lower than 0.70, e.g., 0.53, 0.69.

For non-linear ML model 202, the battery test data 208 can include data from HPPC tests conducted at cycle 2, 102, 202, 302 and 402 (e.g., example 3), or only at cycle 2 (e.g., examples 4, 5, 6). As illustrated in FIG. 5, the accuracy achieved can be comparable between these two sets of HPPC test features, indicating that, in some situations, HPPC testing at cycle 2 alone can yield satisfactory prediction result 210s. Therefore, the ML model 202 can be trained exclusively with cycle 2 data. Accordingly, the battery test data 208 for a battery cell can also include only cycle 2 data as input for prediction by the trained ML model 202'. Such early detection can allow for timely identification of faulty batter cells.

FIGS. 6A-6F show evaluation results of the different combinations of the examples shown in FIG. 5. The evaluation results are shown in the confusion matrix tables. X axis in each confusion matrix table represents predicted label. For example, the predicted label 1 indicates the battery will experience catastrophic fade, while the predicted label 0 indicates that the battery will not experience catastrophic fade. Y axis in each confusion matrix table represents true label. For example, the true label 1 indicates the battery experienced catastrophic fade, while the true label 0 indicates that the battery did not experience catastrophic fade. The confusion matrix table has four main components: (1) True Positives (TP): the cases where the model predicted "positive" correctly, e.g., predicted label=1 and true label=1; (2) True Negatives (TN): the cases where the model predicted "negative" correctly, e.g., predicted label=0 and true label=0; (3) False Positives (FP): the cases where the model predicted "positive" incorrectly, e.g., predicted label=1 and true label=0; and (4) False Negatives (FN): the cases where the model predicted "negative" incorrectly, e.g., predicted label=0 and true label=. Each figure includes three scores: balance accuracy mean score, precision mean score and recall mean score. The balanced accuracy is the arithmetic mean of sensitivity (TP rate) and specificity (TN rate). It gives an accurate measure of the overall performance of a model across all classes, especially when the classes are imbalanced.

In some situations, a relatively low number of nosedivers (e.g., sample battery cells that experienced catastrophic fade) in the data can present a class imbalance challenge for the classification task, as raw data can have a significantly higher number of non-nosedivers than nosedivers. Consequently, any ML model may simply be rewarded for predicting the most frequent class. In some implementations, a random up-sampling is employed using data duplication until both classes have the same frequency. A separate held-out test set can be used that maintains the original class imbalance frequency. Different ML model architectures were used, e.g., simple logistic regression, MLP classifiers, decision trees, support vector machines (SVM) with non-linear kernels. For each of the ML model above, five-fold cross validation was performed, and key performance metrics (accuracy, precision, recall) were evaluated, as shown in FIGS. 5 to 6F.

Figure 6B:
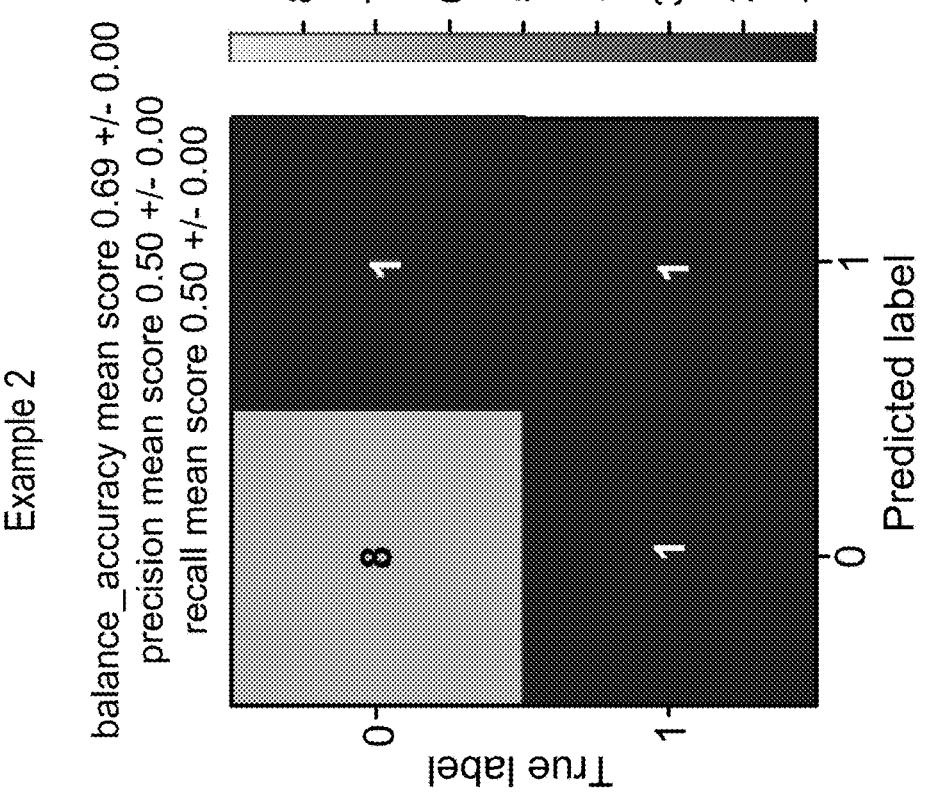
FIGS. 6A-6F show evaluation results of the different combinations in FIG. 5.
Figure 6A:
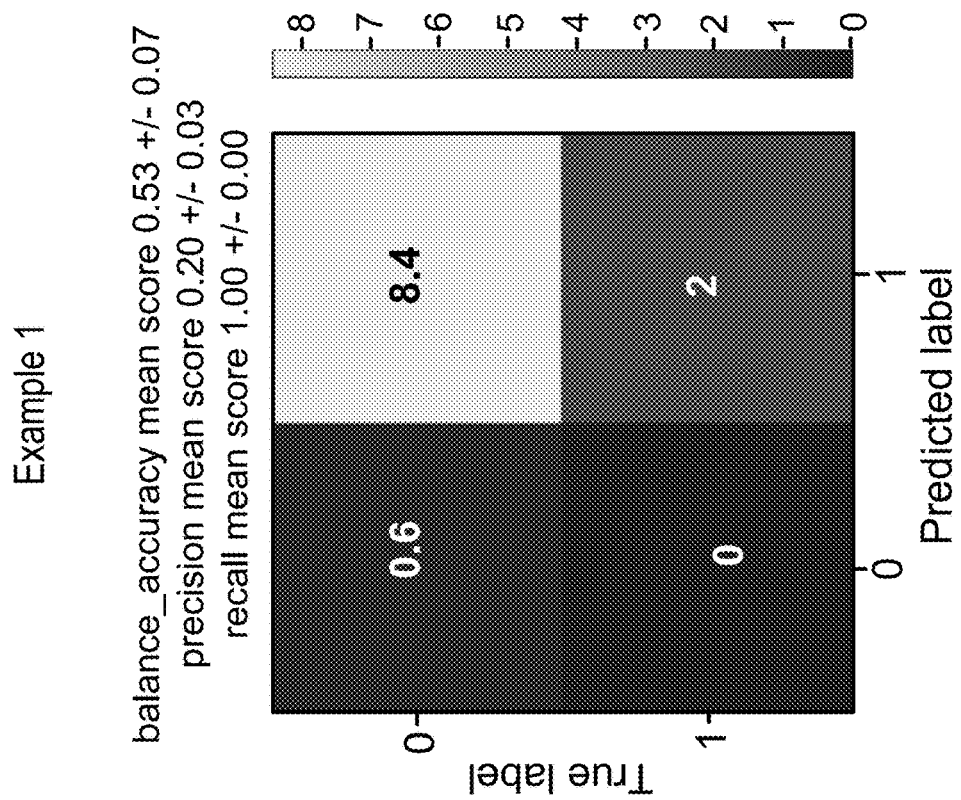
Figure 6D:
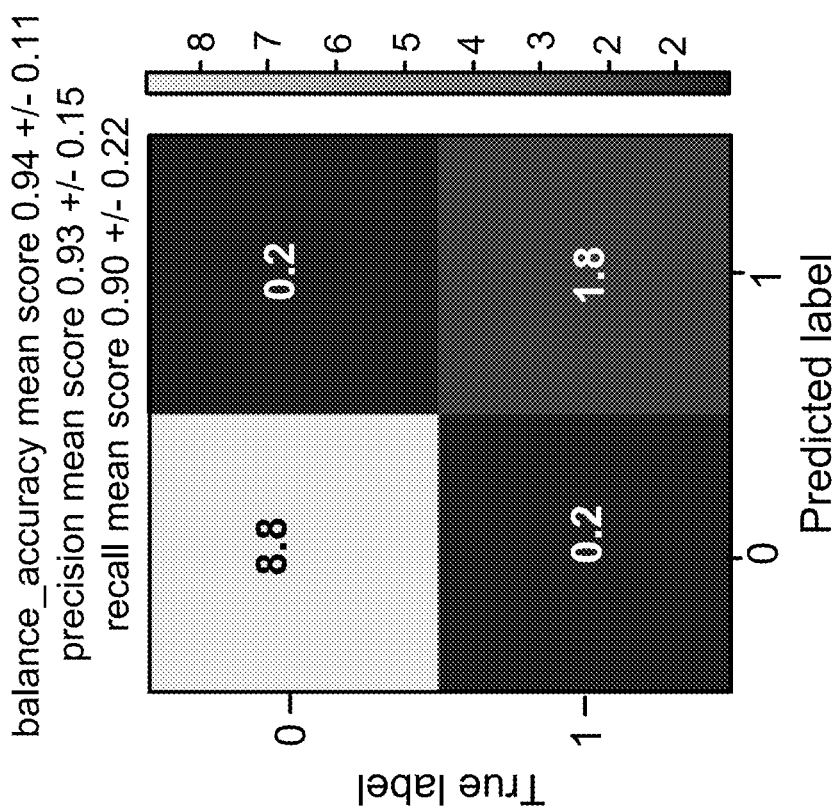
Figure 6C:
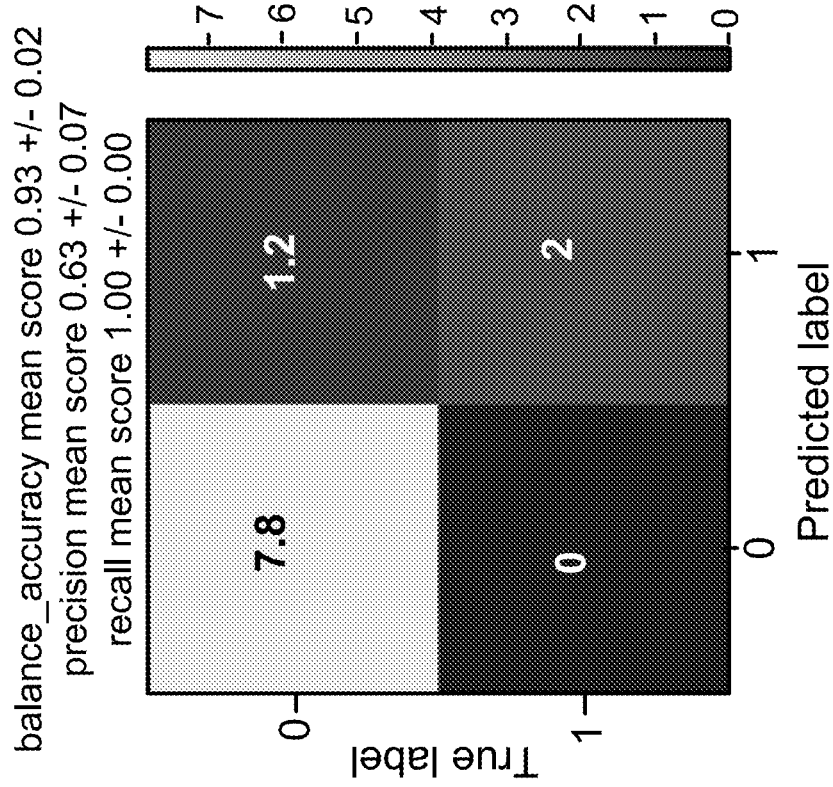
Figure 6F:
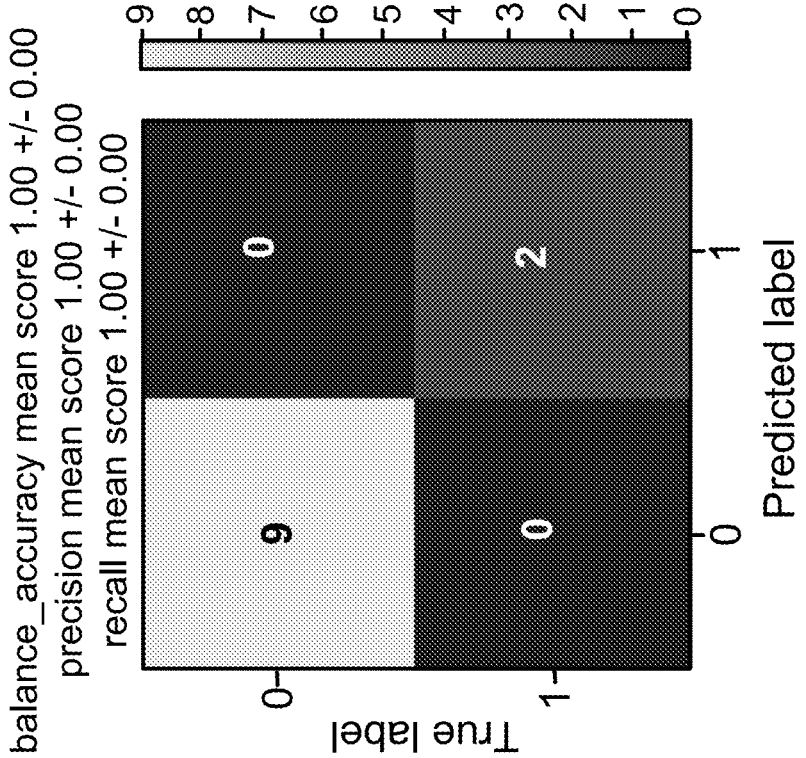
Figure 6E:
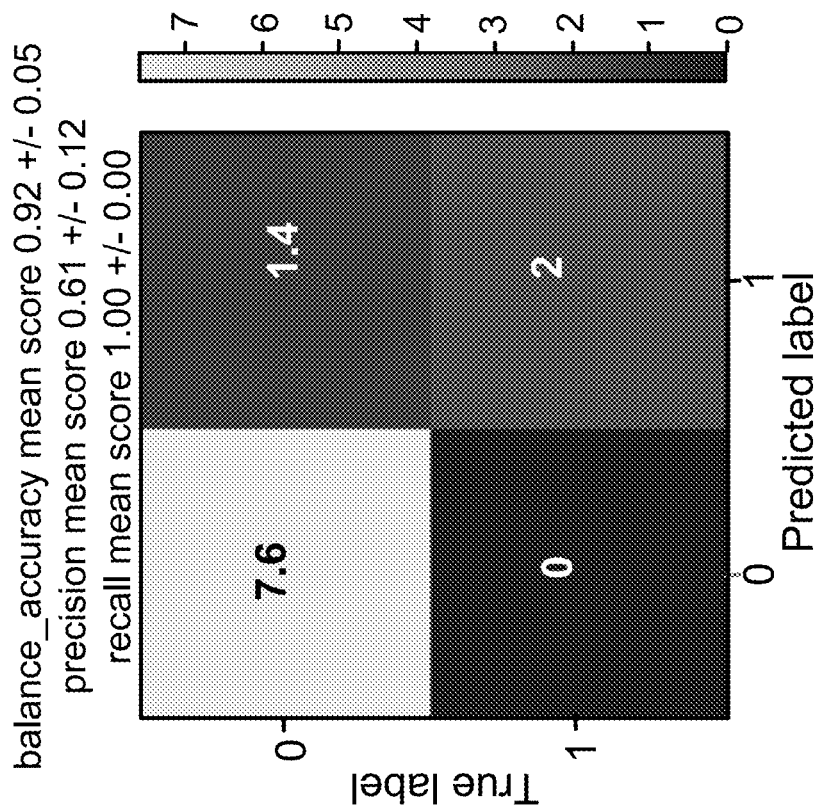

The number in each category for FIGS. 6A-6F represents the counts of correct and incorrect predictions made by the ML models used. For example, as illustrated in FIG. 6B, a linear ML model (e.g., logistic regression) is used to predict a battery defect with HPPC test data at cycle 2. A total of 11 battery cells was used for ML model 202 evaluation. 8 battery cells are in TN, 1 battery cell in TP, 1 battery cell in FN, and 1 battery cell in FP. Therefore, this prediction result 210 has a sensitivity of 0.5, a specificity of 0.89, and correspondingly the balanced accuracy of 0.69. In another example, as illustrated in FIG. 6F, a nonlinear ML model 202 (e.g., decision tree) is used to predict the battery defect with HPPC test data at cycle 2. A total of 11 battery cells was used for the ML model 202 evaluation. 9 battery cells are in TN, 2 battery cells in TP, 0 battery cell in FN, and 0 battery cell in FP. Therefore, this prediction has a balanced accuracy of 1. In addition, the nonlinear ML model 202 can also have better performance in precision and recall performance. For example, in the present example, the nonlinear ML models 202 have precision score in a range of 0.61 to 1 and recall score in a range of 0.9 to 1. In contrast, the linear ML model has precision score in a range of 0.2 to 0.5 and recall score in a range of 0.5 to 1.

In some implementations, a number of cross validations (e.g., 5-fold cross validation) are performed to ensure that a ML model is not overfitting, and a final result can be obtained by averaging results over the number of cross validations (e.g., 5 prediction results). In some examples, to perform a 5-fold cross validation, the dataset is divided into 5 equally sized folds or subsets. In each iteration, one fold is set aside as the evaluation data 206B, while the remaining 4 folds are used as the training data 206A to train the ML model. This process can be repeated 5 times, each time using a different fold as the evaluation data 206B. After each iteration, the ML model's performance can be evaluated on evaluation data 206B using accuracy, precision, and/or recall score. Once all 5 iterations are complete, the performance scores as well as numbers of TP, TN, FP, and FN from each iteration can be averaged to provide an overall assessment of the ML model's performance. In some implementation, one fold of dataset has test data from about 11 sample battery cells. The averaged final results may have decimals, e.g., as illustrated in FIG. 6A, 6C, 6D, or 6E. For example, in FIG. 6D with MLP model, FP is 0.2, indicating that only 1 out of 5 cross validations produced a false positive result on only one battery cell. In contrast, in FIG. 6A with logistic regression model, FP is 8.4, indicating that around 8 out of 11 battery cells are being misclassified for each cross-validation using this linear ML model. Other figures can be interpreted in a similar manner. For example, in FIG. 6F with decision tree model, FN and FP are equal to zero, indicating that there is no misclassification on any battery cell across all 5 cross-validations. Therefore, as illustrated in FIGS. 6A-6F, the nonlinear ML models 202 can exhibit better performance (e.g., accuracy, precision, and recall) compared to linear ML model.

Figure 7:
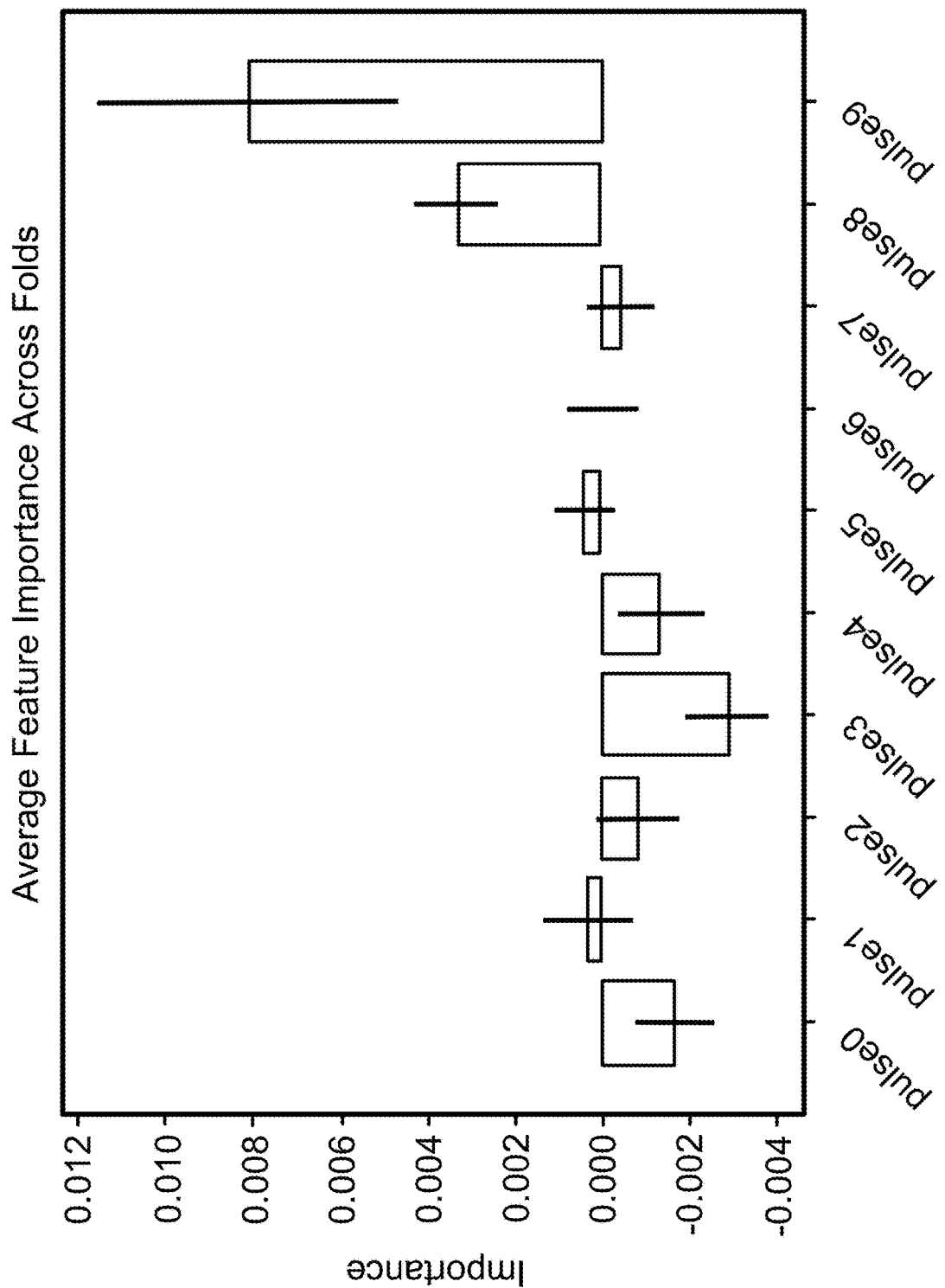
FIG. 7 shows example importance features in HPPC test data.

FIG. 7 shows example importance features in HPPC test data. As noted above, the HPPC test data can include 10 input features, e.g., 10 internal resistance values corresponding to 10 discharging pulses 410 (e.g., pulse 0 to pulse 9). Each discharging pulse 410 can have different importance levels. In some implementations, an importance level of the one or more input features of the input for the ML model 202 is determined based on a result of training the ML model 202. As noted above, during the training process of the ML model 202, the ML model 202 can learn to make predictions or classifications by identifying patterns and relationships within the input data. As the ML model 202 learns, it can assign weights or importance to each input feature, e.g., battery test data 208 associated with each test pulse 410, based on how much they contribute to the ML model 202's predictive performance. In some implementations, the ML model 202 used to determine the importance levels of the input features is Random Forest or Least Absolute Shrinkage and Selection Operator (lasso). In some implementations, the trained ML model 202' (e.g., as illustrated in FIG. 2A) is used to determine the importance levels of features.

Determining the importance level of each input feature associated with a corresponding pulse 410 can help identify the most relevant pulses 410 that contribute significantly to the ML's model performance. As illustrated in FIG. 7, in the present example, the last two pulses 410 (e.g., pulse 8 and pulse 9 near the 10% SOC and 0% SOC, respectively) have higher importance levels compared to other pulses 410. Without being bound to any particular theory, the rise in diffusion impedance from the cathode side may predominantly influence the catastrophic fade of battery cells.

In some implementations, one or more parameters, e.g., weight of each pulse 410, of the ML model 202 are adjusted based on the determined importance levels of the one or more input features of the input. For example, in response to determining that the two or more last pulses 410 close to a completion of a discharging portion of a battery cycle have higher importance levels, the weights of these pulses 410 (e.g., pulse 8 and pulse 9) in the ML model 202 can be adjusted to have a greater value than those of other pulses 410. In some implementations, the plurality of current pulses 410 is applied only in two or more last periods 412 close to a completion of the discharging portion. For example, the discharging pulses 410 can be applied only when SOC is equal to about 10% and about 0%. The HPPC test data from these two discharging pulses 410 can be then used as input for the trained ML model 202's prediction. This approach can help reduce data size, enhance processing speed, and improve efficiency.

Figure 8:
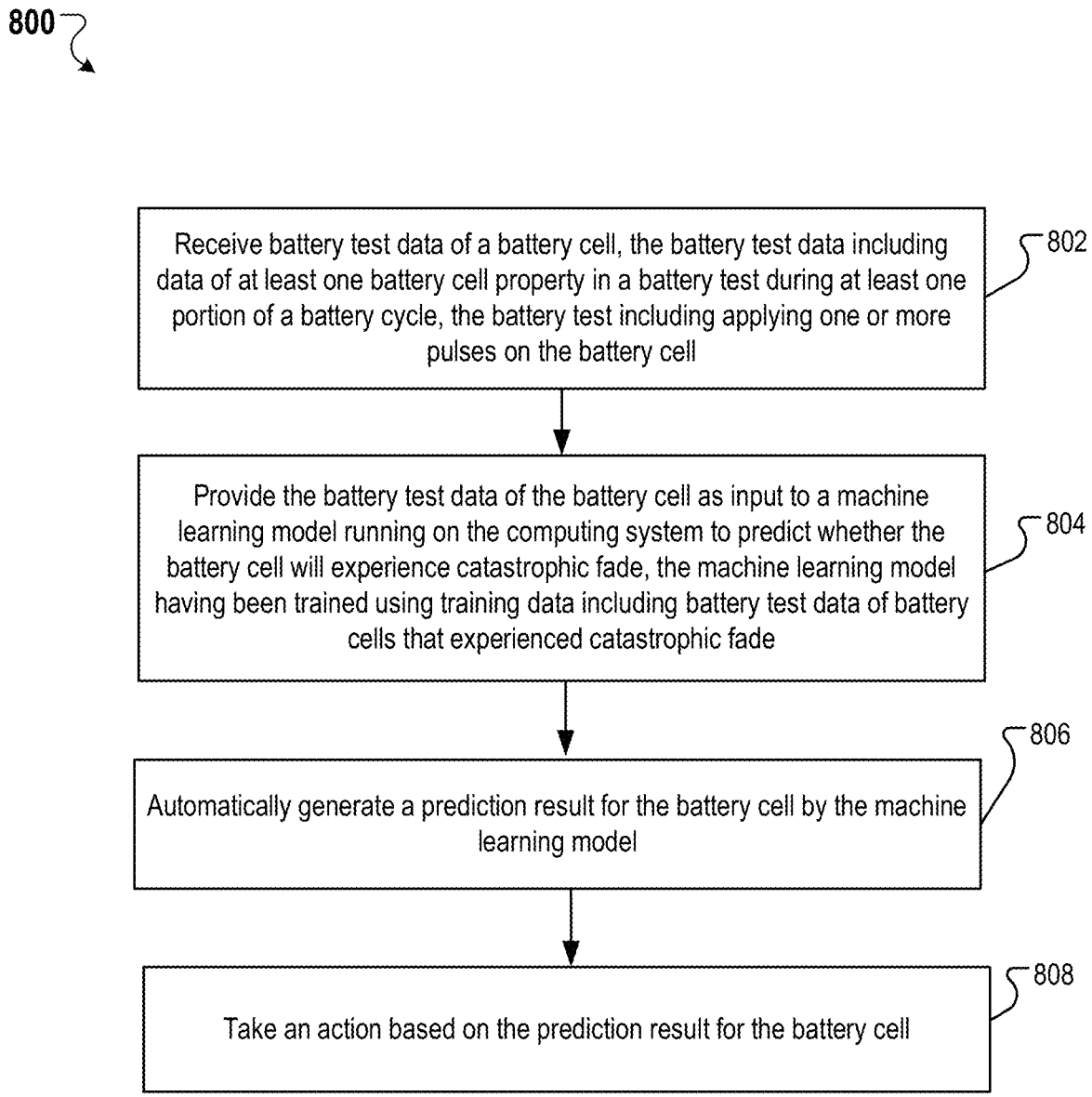
FIG. 8 is a flowchart of an example process of predicting battery defects with a machine learning model.

FIG. 8 is a flowchart of an example process 800 of predicting battery defects with a ML model 202. The process 800 can be performed by a computing system, e.g., the cloud computing system 130 of FIG. 1A or 1B.

At step 802, battery test data of a battery cell is received. The battery test data includes data of at least one battery cell property in a battery test during at least one portion of a battery cycle. The battery test includes applying one or more pulses on the battery cell. The battery test data can be, e.g., the battery test data 208 of FIG. 2A. The at least one battery cell property can include internal resistance as described in FIGS. 3-4.

In some implementations, the battery cycle is a single cycle having a charging portion and a discharging portion. The at least one portion of the battery cycle includes at least one of the charging portion or the discharging portion. The discharging portion can be, e.g., the discharging portion 420 of FIG. 4.

In some implementations, the battery test includes at least one of Hybrid Pulse Power Characterization (HPPC) test, minimum pulse power characterization (MPPC) test, or Direct Current Internal Resistance (DCIR) test. The HPPC test can be the test described in FIGS. 3 and 4.

In some implementations, the battery test data 208 includes the test data gathered in a single battery cycle. In some implementations, the battery test data 208 can include HPPC test data.

In some implementations, as described in FIG. 4, the one or more pulses include a current pulse applied on the battery cell when a capacity of the battery cell is changed by a predetermined percentage of state of charge (SOC). The at least one battery cell property includes an internal resistance corresponding to the current pulse. The pulse can be, e.g., the pulse 410 of FIG. 4.

In some implementations, the battery test includes applying each of a plurality of current pulses on the battery cell when the capacity of the battery cell is changed from a respective charge by the predetermined percentage of SOC. The battery test data includes data of a plurality of internal resistances that are determined based on the plurality of current pulses, and a number of the plurality of internal resistances is identical to a number of the plurality of current pulses. The predetermined percentage of SOC can be 10%. The number of the current pulses can be 10 for each battery cycle, as illustrated in FIG. 4.

In some implementations, the at least one portion of the battery cycle includes the discharging portion having multiple periods associated with the predetermined percentage of SOC. Each of the plurality of current pulses is a current discharging pulse applied in a respective period of the multiple periods. The period can be, e.g., the period 412 of FIG. 4. The current discharging pulse can be, e.g., the pulse 410 of FIG. 4.

In some implementations, the plurality of current pulses is applied in two or more last periods close to a completion of the discharging portion. The two or more last periods can be, e.g., the pulse 8 and the pulse 9 of FIG. 7.

In some implementations, the battery cycle is within first 10 cycles of a lifetime of the battery cell.

In some implementations, the battery cycle is 2nd cycle of the lifetime of the battery cell.

In some implementations, the battery test data 208 includes data of the at least one battery cell property in the battery test during two or more battery cycles. The at least one battery cell property can include internal resistance, as described in FIG. 4.

At step 804, the battery test data of the battery cell is provided as input to a ML model running on the computing system to predict whether the battery cell will experience catastrophic fade. The ML model has been trained using training data including battery test data of battery cells that experienced catastrophic fade. The ML model can be, e.g., the trained ML model 202' of FIG. 2A, or the MLP model

250 of FIG. 2B. The computer system can be, e.g., the battery defect identification application stored in the cloud computing platform.

In some implementations, a catastrophic fade in a lithium-ion battery cell is defined numerically as a loss of over 20% of its total capacity within less than 1% of its expected lifecycle in terms of charge-discharge cycles.

In some implementations, the ML model uses nonlinear algorithms, including without limitation to, multilayer perceptron classifier (MLP), decision trees, random forests, neural networks, support vector machines (SVM) with non-linear kernels, or gradient boosting machines.

In some implementations, the data of the at least one battery cell property in a battery test includes one or more values, and each of the one or more values corresponds to a respective pulse of the one or more pulses. Each of the one or more values is used as a respective input feature of one or more input features of the input to the machine learning model.

In some implementations, the battery test data of the battery cells that experienced catastrophic fade includes data collected when a loss of capacity of one of the battery cells with respect to status of charge (SOC) in a single cycle is beyond a predetermined threshold. In some implementations, the predetermined threshold is a loss of over 20% of maximum capacity of a battery cell within less than 1% of its expected lifecycle in terms of charge-discharge cycles.

In some implementations, the training data include battery test data for battery cells that have a normal lifetime without catastrophic fade.

In some implementations, as described in FIG. 7, the method includes training the machine learning model using the training data; determining importance of the one or more input features of the input for the machine learning model based on a result of training the machine learning model; and adjusting one or more parameters of the machine learning model based on the determined importance of the one or more input features of the input.

In some implementations, the machine learning model is a first machine learning model trained for defect identification for a first type of battery cells. A second machine learning mode running on the computing system has been trained for defect identification for a second type of battery cells. The first type of battery cells and the second type of battery cells have different battery cell chemistry.

In some implementations, the machine learning model is trained for defect identification for two or more types of battery cells that have different battery cell chemistry.

In some implementations, the method includes after training the machine learning model with the training data, evaluating the machine learning model with evaluation data. The evaluation data includes battery test data of first battery cells that experienced catastrophic fade and battery test data of second battery cells that have a normal lifetime without catastrophic fade. The method includes adjusting, based on a result of evaluating the machine learning model, one or more parameters of the machine learning model to further train the machine learning model. The evaluation data can be, e.g., the evaluation data 206B in FIG. 2A. Examples of evaluations data are described in FIGS. 5-6F.

At step 806, in response, a prediction result for the battery cell is automatically generated by the ML model. The prediction result can be, e.g., the prediction result 210 of FIG. 2A. In some implementations, the prediction result 210 indicates one of: i) the battery cell being a defective battery cell that will experience catastrophic fade, and ii) the battery cell being a normal battery cell that will not experience catastrophic fade.

In some implementations, the method includes updating one or more parameters of the machine learning model based on the battery test data of the battery cell and the prediction result for the battery cell.

At step 808, an action is taken based on the prediction result 210 for the battery cell. The action can include transmitting at least one of i) the prediction result for the battery cell or ii) an indication of a quality control (QC) for the battery cell to the remote computing device through the communication network. Alternatively, or in addition, the action taken by the cloud computing platform 130 can include presenting at least one of i) the prediction result for the battery cell or ii) an indication of a quality control (QC) for the battery cell on a web portal of the computing system to be accessible by the remote computing device.

In some implementations, the indications of QC for the battery cell includes, without limitation to, suggested root cause analysis (e.g., reviewing manufacturing record), corrective actions (e.g., replacing the battery cells, adjusting manufacturing processes, updating quality control procedures, or improving design specifications), isolation of the problem (e.g., isolating the problematic battery cell or cells from the rest of the batch or production line), suggested quality control analysis, or research and development (e.g., recommending new materials or new process flows).

In some implementations, a method includes receiving battery test data for at least a portion of a battery cycle; and determining, based at least on the battery test data and using a ML model 202, whether a particular battery cell has a likelihood to experience catastrophic fade that is above a threshold. The ML model 202 has been trained using training data 206A including battery test data for battery cells that experienced catastrophic fade. The method further includes taking an action at least partially based on the determination of whether the particular battery cell has a likelihood to experience catastrophic fade that is above the threshold.

In some implementations, determining whether the particular battery cell has the likelihood to experience catastrophic fade that is above the threshold includes: determining an accuracy of a prediction that the particular battery cell will experience catastrophic fade using the ML model 202; determining a precision of the accuracy of the prediction; and determining whether the particular battery cell has the likelihood to experience catastrophic fade that is above the threshold based on at least the accuracy and the precision of the accuracy. In some implementations, the threshold is set to be 0.5.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory storage medium for execution by, or to control the operation of, data processing apparatus. The computer storage medium can be a machine-readable storage device, a machine-readable storage substrate, a random or serial access memory device, or a combination of one or more of them. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus.

The term "data processing apparatus" refers to data processing hardware and encompasses all kinds of apparatus, devices, and machines for processing data, including by way of example a programmable processor, a computer, or multiple processors or computers. The apparatus can also be, or further include, special purpose logic circuitry, e.g., an FPGA (field programmable gate array) or an ASIC (application-specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, an app, a module, a software module, a script, or code, can be written in any form of programming language, including compiled or interpreted languages, or declarative or procedural languages; and it can be deployed in any form, including as a stand-alone program or as a module, component, subroutine, or other unit suitable for use in a computing environment. A program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a data communication network.

The processes and logic flows described in this specification can be performed by one or more programmable computers executing one or more computer programs to perform functions by operating on input data and generating output. The processes and logic flows can also be performed by special purpose logic circuitry, e.g., an FPGA or an ASIC, or by a combination of special purpose logic circuitry and one or more programmed computers.

Computers suitable for the execution of a computer program can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. The central processing unit and the memory can be supplemented by, or incorporated in, special purpose logic circuitry. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser. Also, a computer can interact with a user by sending text messages or other forms of message to a personal device, e.g., a smartphone, running a messaging application, and receiving responsive messages from the user in return.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface, a web browser, or an app through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some implementations, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

The invention claimed is:

1. A computer-implemented method for battery defect identification by a computing system, the computer-implemented method comprising:
performing a battery test by applying a plurality of pulses on a target battery cell during a battery cycle to generate battery test data of the target battery cell, the battery test data comprising data of at least one battery cell property in the battery test during the battery cycle;
providing the battery test data of the target battery cell as input to a machine learning model running on the computing system to predict whether the target battery cell will experience catastrophic fade, wherein the machine learning model has been trained using training battery test data of battery cells that experienced catastrophic fade, and, in response,
automatically generating a prediction result for the target battery cell by the machine learning model; and
taking an action based on the prediction result for the target battery cell,
wherein the at least one battery cell property comprises an internal resistance of the target battery cell, the battery test data comprises values of a plurality of internal resistances of the target battery cell, each of the plurality of internal resistances corresponds to a respective pulse of the plurality of pulses, and wherein each of the plurality of pulses has a respective importance level, a value of each of the plurality of internal resistances in the data has a respective weight in the machine learning model, and the respective weight of the internal resistance is based on an importance level of a corresponding pulse of the plurality of pulses associated with the internal resistance.

2. The computer-implemented method of claim 1, wherein the prediction result indicates one of:
i) the target battery cell being a defective battery cell that will experience catastrophic fade, and
ii) the target battery cell being a normal battery cell that will not experience catastrophic fade.

3. The computer-implemented method of claim 1, wherein the battery test comprises at least one of Hybrid Pulse Power Characterization (HPPC) test, minimum pulse power characterization (MPPC) test, or Direct Current Internal Resistance (DCIR) test.

4. The computer-implemented method of claim 1, wherein the battery cycle is a single cycle having a charging portion and a discharging portion, and
wherein the battery test data comes from the discharging portion of the battery cycle.

5. The computer-implemented method of claim 1, wherein the battery test comprises applying each of the plurality of pulses on the target battery cell when a capacity of the target battery cell is changed from a respective charge by a predetermined percentage of state of change (SOC), and
wherein the battery test data comprises the values of the plurality of internal resistances that are determined based on the plurality of pulses, and a number of the plurality of internal resistances is identical to a number of the plurality of pulses.

6. The computer-implemented method of claim 5, wherein the discharging portion of the battery cycle has multiple periods associated with the predetermined percentage of SOC, and each of the plurality of pulses is a current discharging pulse applied in a respective period of the multiple periods.

7. The computer-implemented method of claim 6, wherein the plurality of pulses are applied in two or more last periods close to a completion of the discharging portion, and there is no pulse applied in one or more other periods of the discharging portion, an importance level associated with each of the two or more last periods being higher than an importance level associated with each of the one or more other periods.

8. The computer-implemented method of claim 1, wherein the battery test data of the target battery cell comes from only a single cycle.

9. The computer-implemented method of claim 8, wherein the single cycle is within first 20 cycles of a lifetime of the target battery cell.

10. The computer-implemented method of claim 1, wherein the machine learning model comprises at least one nonlinear algorithm, and wherein the at least one nonlinear algorithm comprises at least one of Multilayer Perceptron Classifier (MLP), support vector machines (SVM) with nonlinear kernels, Decision Trees, Random Forests, artificial neural network, or gradient boosting machine (GBM).

11. The computer-implemented method of claim 1, wherein the machine learning model is trained for defect identification for two or more types of battery cells that have different battery cell chemistry.

12. The computer-implemented method of claim 1, further comprising:
after training the machine learning model with the training battery test data, evaluating the machine learning model with evaluation data, the evaluation data comprising battery test data of first battery cells that experienced catastrophic fade and battery test data of second battery cells that have a normal lifetime without catastrophic fade; and
adjusting, based on a result of evaluating the machine learning model, one or more parameters of the machine learning model to further train the machine learning model.

13. The computer-implemented method of claim 1, further comprising:
updating one or more parameters of the machine learning model based on the battery test data of the target battery cell and the prediction result for the target battery cell.

14. The computer-implemented method of claim 1, wherein the battery test data of the battery cells that experienced catastrophic fade comprises data collected when a loss of capacity of one of the battery cells with respect to state of charge (SOC) in a single cycle is beyond a predetermined threshold.

15. The computer-implemented method of claim 1, further comprising:
receiving the battery test data of the target battery cell from a remote computing device in communication with the computing system through a communication network, and
wherein taking the action based on the prediction result for the target battery cell comprises at least one of:
transmitting at least one of i) the prediction result for the target battery cell or ii) an indication of a quality control (QC) for the target battery cell to the remote computing device through the communication network, or
presenting at least one of i) the prediction result for the target battery cell or ii) an indication of a quality control (QC) for the target battery cell on a web portal of the computing system to be accessible by the remote computing device.

16. The computer-implemented method of claim 1, wherein each of the values of the plurality of internal resistances is used as a respective input feature of a plurality of input features of the input to the machine learning model, and a number of the values is identical to a number of the plurality of input features.

17. The computer-implemented method of claim 1, further comprising:
training the machine learning model using the training battery test data;
determining importance of the plurality of input features of the input for the machine learning model based on a result of training the machine learning model; and
adjusting the respective weights of the values of the plurality of internal resistances of the machine learning model based on the determined importance of the plurality of input features of the input.

18. A computer-implemented method for battery defect identification by a computing system, the computer-implemented method comprising:
performing a battery test by applying a plurality of pulses on a target battery cell in a single battery cycle to generate battery test data in the single battery cycle of the target battery cell, the battery test data comprising data of at least one battery cell property in the battery test during the single battery cycle;
providing the battery test data of the target battery cell as input to a machine learning model running on the computing system to predict whether the target battery cell will experience catastrophic fade, wherein the machine learning model has been trained using training battery test data of battery cells that experienced catastrophic fade, and, in response,
automatically generating a prediction result for the target battery cell by the machine learning model; and
taking an action based on the prediction result for the target battery cell,
wherein the at least one battery cell property comprises an internal resistance of the target battery cell, the battery test data comprises values of a plurality of internal resistances of the target battery cell, each of the plurality of internal resistances corresponds to a respective pulse of the plurality of pulses, and wherein each of the plurality of pulses has a respective importance level, a value of each of the plurality of internal resistances in the data has a respective weight in the machine learning model, and the respective weight of the internal resistance is based on an importance level of a corresponding pulse of the plurality of pulses associated with the internal resistance.

19. A method comprising:
performing a battery test by applying a plurality of pulses on a particular battery cell during a battery cycle to obtain battery test data for at least a portion of the battery cycle of the particular battery cell, the battery test data comprising data of at least one battery cell property in the battery test during the particular battery cycle;
determining, based at least on the battery test data and using a machine learning model, whether the particular battery cell has a likelihood to experience catastrophic fade that is above a threshold, wherein the machine learning model has been trained using training battery test data for battery cells that experienced catastrophic fade; and
taking an action at least partially based on the determination of whether the particular battery cell has a likelihood to experience catastrophic fade that is above the threshold,
wherein the at least one battery cell property comprises an internal resistance of the particular battery cell, the battery test data comprises values of a plurality of internal resistances of the particular battery cell, each of the plurality of internal resistances corresponds to a respective pulse of the plurality of pulses, and wherein each of the plurality of pulses has a respective importance level, a value of each of the plurality of internal resistances in the data has a respective weight in the machine learning model, and the respective weight of the internal resistance is based on an importance level of a corresponding pulse of the plurality of pulses associated with the internal resistance.

20. The method of claim 19, wherein taking the action comprises providing an indication to cause a user to perform at least one of:
replacing the particular battery cell if the particular battery cell has the likelihood to experience catastrophic fade,
isolating the particular battery cell or one or more other battery cells from a same batch or a same production line,
adjusting a manufacturing process for making the particular battery cell,
updating a quality control procedure for the particular battery cell, or
improving a design specification of the particular battery cell.

21. A system comprising:
one or more computers; and
one or more storage devices on which are stored instructions that are operable, when executed by the one or more computers, to cause the one or more computers to perform operations for battery defect identification, the operations comprising:
performing a battery test by applying a plurality of pulses on a target battery cell during a battery cycle to generate battery test data of the target battery cell, the battery test data comprising data of at least one battery cell property in the battery test during the battery cycle, providing the battery test data of the target battery cell as input to a machine learning model running on the system to predict whether the target battery cell will experience catastrophic fade, wherein the machine learning model has been trained using training battery test data of battery cells that experienced catastrophic fade, and, in response, automatically generating a prediction result for the target battery cell by the machine learning model; and taking an action based on the prediction result for the target battery cell, wherein the at least one battery cell property comprises an internal resistance of the target battery cell, the battery test data comprises values of a plurality of internal resistances of the target battery cell, each of the plurality of internal resistances corresponds to a respective pulse of the plurality of pulses, and wherein each of the plurality of pulses has a respective importance level, a value of each of the plurality of internal resistances in the data has a respective weight in the machine learning model, and the respective weight of the internal resistance is based on an importance level of a corresponding pulse of the plurality of pulses associated with the internal resistance.

* * * * *